US012628520B2

(12) United States Patent　　　(10) Patent No.:　US 12,628,520 B2
Chen　　　　　　　　　　　　　(45) Date of Patent:　May 12, 2026

(54) DISPLAY PANEL AND DISPLAY DEVICE

(71) Applicant: Xiamen Tianma Display Technology Co., Ltd., Xiamen (CN)

(72) Inventor: Guoxing Chen, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 496 days.

(21) Appl. No.: 18/218,724

(22) Filed: Jul. 6, 2023

(65) Prior Publication Data

US 2024/0349559 A1　　Oct. 17, 2024

(30) Foreign Application Priority Data

Apr. 13, 2023　(CN) .......................... 202310395024.0

(51) Int. Cl.
H10K 59/131　　　(2023.01)
G09G 3/32　　　　(2016.01)

(52) U.S. Cl.
CPC ........... H10K 59/1315 (2023.02); G09G 3/32 (2013.01); G09G 2300/0426 (2013.01); G09G 2300/0819 (2013.01); G09G 2300/0842 (2013.01); G09G 2300/0861 (2013.01)

(58) Field of Classification Search
None
See application file for complete search history.

(56) References Cited

U.S. PATENT DOCUMENTS

| | | | | |
|---|---|---|---|---|
| 2015/0177582 A1 * | 6/2015 | Lai | .................... | G02F 1/136286 |
| | | | | 349/43 |
| 2017/0033171 A1 * | 2/2017 | Kim | ...................... | G09G 3/3233 |
| 2022/0366830 A1 * | 11/2022 | Zhang | .................. | G09G 3/2092 |
| 2023/0413606 A1 * | 12/2023 | Lee | ...................... | H10D 86/441 |

FOREIGN PATENT DOCUMENTS

| | | | | | |
|---|---|---|---|---|---|
| CN | 110600532 A | * | 12/2019 | ............. | H10K 59/12 |
| CN | 111627393 A | * | 9/2020 | ........... | G09G 3/3291 |
| CN | 113972237 A | * | 1/2022 | ........... | G09G 3/3225 |
| CN | 115250637 A | * | 10/2022 | ......... | H10K 59/1315 |
| CN | 118872410 A | * | 10/2024 | ......... | H10K 59/1213 |
| CN | 222263527 U | * | 12/2024 | | |
| CN | 115244701 B | * | 3/2025 | ........... | G09G 3/3233 |
| WO | WO-2021226785 A1 | * | 11/2021 | ......... | H10K 59/8731 |

* cited by examiner

*Primary Examiner* — Michael Lebentritt
(74) *Attorney, Agent, or Firm* — Anova Law Group, PLLC

(57)　　　　ABSTRACT
A display panel and a display device are provided. The display panel includes an array substrate including a first column of pixel circuits, a second column of pixel circuits adjacently arranged in a second direction intersecting a first direction, and a third column of pixel circuits. A first data signal line and a first auxiliary signal line extending along the second direction are arranged between two columns of pixel circuits and the first auxiliary signal line is electrically connected to a third data signal line corresponding to the third column of pixel circuits through a first connection section in the first connection signal line extending in the first direction. A first gap formed between a first non-connection section in the first connection signal line and the first connection section is blocked by the first data signal line in a direction perpendicular to the display panel.

20 Claims, 22 Drawing Sheets

ND1

DISPLAY PANEL AND DISPLAY DEVICE

CROSS-REFERENCE TO RELATED APPLICATION

This application claims the priority of Chinese Patent Application No. 202310395024.0, filed on Apr. 13, 2023, the content of which is incorporated by reference in its entirety.

TECHNICAL FIELD

The present disclosure generally relates to the field of display technologies and, more particularly, relates to a display panel and a display device.

BACKGROUND

With the continuous development of display technologies, the frame of the display panel has become narrower and narrower. To reduce the bottom frame of the display panel, a portion of the fan-out lines may be arranged in the display area (i.e., "fanout in AA" or FIAA). However, in the existing FIAA display panel, metal wirings may be arranged with different densities in the FIAA area (display area that realizes FIAA connection) and the non-FIAA area (normal display area). The density difference of metal wirings makes the light reflected by the metal wirings be different, resulting in uneven visibility (i.e., Mura phenomena) in the FIAA area and non-FIAA area in the dark state and display state in the display.

The disclosed display panels and display devices are direct to solve one or more problems set forth above and other problems in the arts.

SUMMARY

One aspect of the present disclosure provides a display panel. The display panel includes an array substrate. The array substrate includes multiple columns of pixel circuits arranged along a first direction and extending along a second direction. The first direction intersects the second direction, the multiple columns of pixel circuits include a first column of pixel circuits and a second column of pixel circuits adjacently arranged in the second direction, and a third column of pixel circuits different from the first column of pixel circuits and the second column of pixel circuits; a first data signal line and a first auxiliary signal line extending along the second direction are arranged between the first column of pixel circuits and the second column of pixel circuits, the first auxiliary signal line is located a side of the data signal line adjacent to the third column of pixel circuits, the first data signal line is electrically connected to the first column of pixel circuits or the second column of pixel circuits, the first auxiliary signal line is electrically connected to a third data signal line corresponding to the third column of pixel circuits through a first connection section in the first connection signal line extending in the first direction, the first connection signal line further includes a first non-connection section, the first non-connection section is located on a side of the first auxiliary signal line away from the first connection section, a first gap is formed between the first connection section and the first non-connection section; and in a direction perpendicular to a plane where the display panel is located, the first gap is blocked by the first data signal line.

Another aspect of the present disclosure provides a display device. The display device includes a display panel.

The display panel includes an array substrate. The array substrate includes multiple columns of pixel circuits arranged along a first direction and extending along a second direction. The first direction intersects the second direction, the multiple columns of pixel circuits include a first column of pixel circuits and a second column of pixel circuits adjacently arranged in the second direction, and a third column of pixel circuits different from the first column of pixel circuits and the second column of pixel circuits; a first data signal line and a first auxiliary signal line extending along the second direction are arranged between the first column of pixel circuits and the second column of pixel circuits, the first auxiliary signal line is located a side of the data signal line adjacent to the third column of pixel circuits, the first data signal line is electrically connected to the first column of pixel circuits or the second column of pixel circuits, the first auxiliary signal line is electrically connected to a third data signal line corresponding to the third column of pixel circuits through a first connection section in the first connection signal line extending in the first direction, the first connection signal line further includes a first non-connection section, the first non-connection section is located on a side of the first auxiliary signal line away from the first connection section, a first gap is formed between the first connection section and the first non-connection section; and in a direction perpendicular to a plane where the display panel is located, the first gap is blocked by the first data signal line.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings may also be obtained from these drawings without creative effort.

DETAILED DESCRIPTION

The following will clearly and completely describe the technical solutions in the embodiments of the disclosure with reference to the drawings in the embodiments of the disclosure. Apparently, the described embodiments are only some of the embodiments of the disclosure, not all of them. Based on the embodiments in the present disclosure, all other embodiments obtained by persons of ordinary skill in the art without making creative efforts belong to the scope of protection of this disclosure.

In the following description, a lot of specific details are set forth to fully understand the disclosure, but the disclosure can also be implemented in other ways different from those described here, and those skilled in the art can do without violating the connotation of the disclosure. By analogy, the present disclosure is therefore not limited by the specific embodiments disclosed below.

Secondly, the present disclosure is described in detail in combination with schematic diagrams. When describing the embodiments of the present disclosure in detail, for the convenience of explanation, the cross-sectional view showing the device structure will not be partially enlarged according to the general scale, and the schematic diagram is only an example, which should not limit the protection scope of this disclosure. In addition, the three-dimensional space dimensions of length, width and depth should be included in actual production.

In the existing FIAA display panel, there is a density difference in the metal wiring between the FIAA area (the display area that realizes the FIAA connection) and the non-FIAA area (the normal display area). The light reflected by the wirings is uneven, resulting in the phenomenon of uneven visibility (Mura) in the dark state and the display state in the FIAA area and non-FIAA area.

Figure 1:
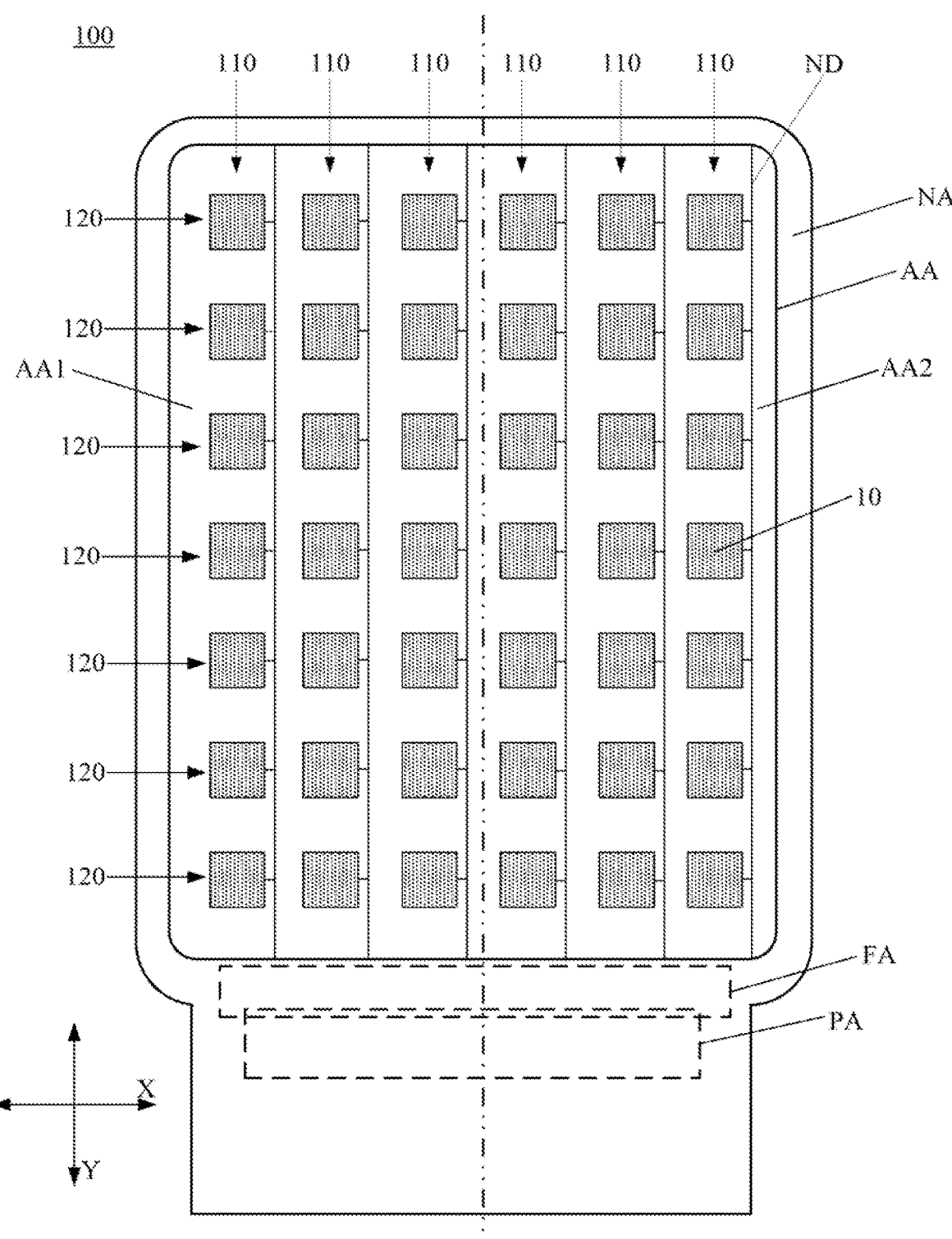
FIG. 1 is a schematic top view of an array substrate in an exemplary display panel according to various disclosed embodiments of the present disclosure.

The present disclosure provides a display panel and a display device. The display panel may include an array substrate. FIG. 1 illustrates a schematic top view of an exemplary array substrate 100 in the display panel according to various embodiments of the present disclosure. As shown in FIG. 1, the array substrate 100 may include multiple columns of pixel circuits 110 arranged in a first direction X and extending in a second direction Y. The first direction X may intersect the second direction Y.

As shown in FIG. 1, the array substrate 100 may include a plurality of pixel circuits 10, and the plurality of pixel circuits 10 may form the multiple columns of pixel circuits 110 arranged in the first direction X and extending in the second direction Y. Each column of pixel circuits 110 may need to be connected to a data signal line ND extending in the second direction Y to provide data signals to the column of pixel circuits 110 such that the column of pixel circuits 110 may drive the corresponding light-emitting elements to emit light.

Figure 2:
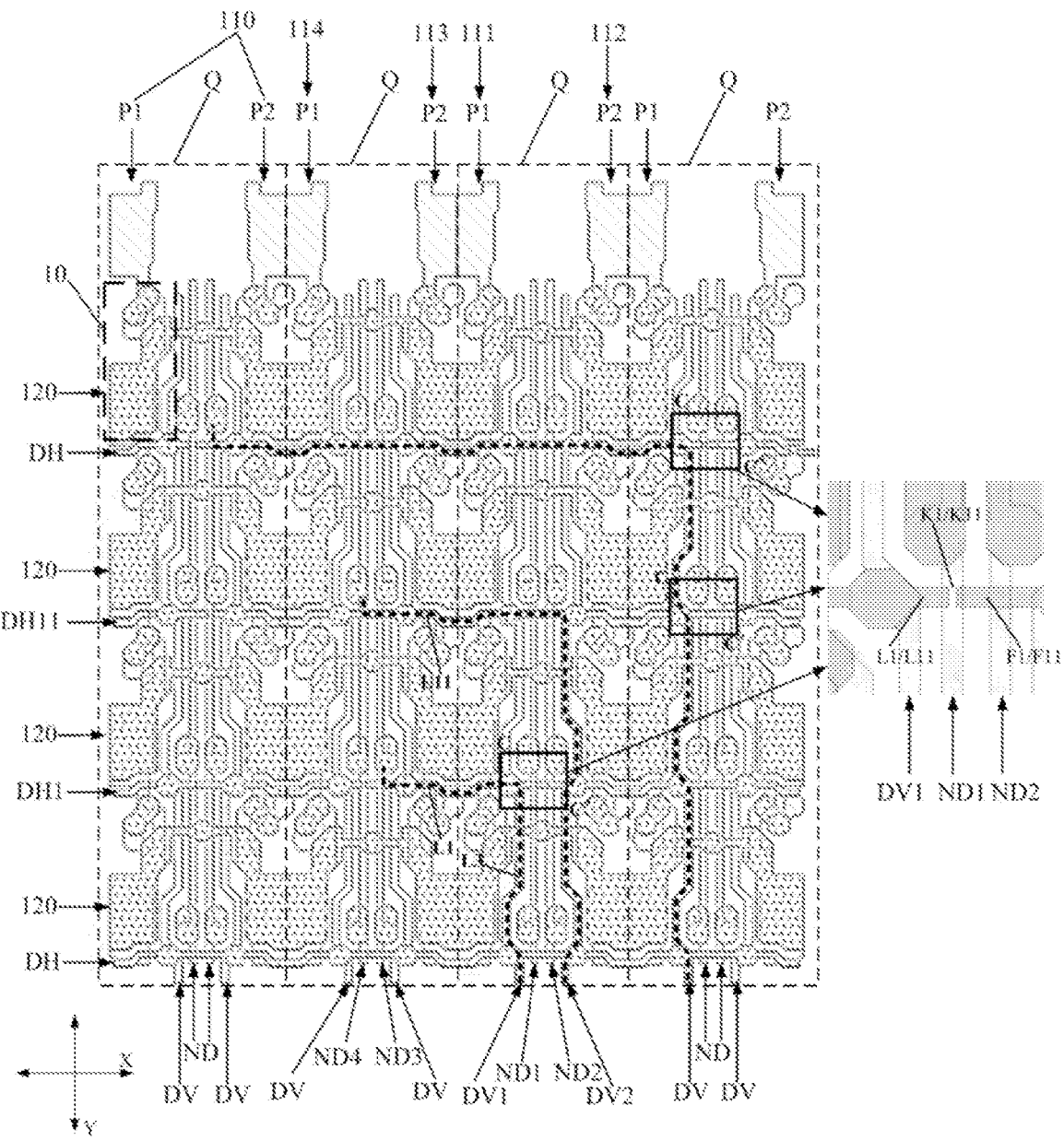
FIG. 2 is a schematic diagram of a partial layout of an exemplary display panel according to various disclosed embodiments of the present disclosure.

FIG. 2 illustrates a schematic diagram of a partial layout of an exemplary display panel according to various disclosed embodiments of the present disclosure. As shown in FIG. 2, the multiple columns of pixel circuit 110 may include a plurality of column repeating units Q arranged in the first direction X. A column repeating unit Q may include two columns of pixel circuits 110 (P1 column of pixel circuits and P2 column of pixel circuits) arranged adjacently in the first direction X. In the two columns of repeating units Q arranged adjacently in the first direction X, the P1 column of pixel circuits in one column repeating unit Q may be adjacent to the P2 column of pixel circuits in another adjacent column repeating unit Q, and the P2 column of pixel circuits in one column repeating unit Q may be adjacent to another adjacent P1 column of pixel circuits in the repeating unit Q.

As shown in FIG. 2, in each column repeating unit Q, two columns of pixel circuits 110 (the P1 column of pixel circuits and the P2 column of pixel circuits) adjacently arranged in the first direction X may be electrically connected data signal lines ND respectively to receive respective data signals.

As shown in FIG. 1 and FIG. 2, the plurality of pixel circuits 10 may also form a plurality of rows of pixel circuits 120 arranged in the second direction Y and extending in the first direction X. At this time, the plurality of pixel circuits 10 may be arranged as an array.

As shown in FIG. 1, the display panel may include a display area AA and a non-display area NA at least partially surrounding the display area AA. The non-display area NA may include a fan-out area FA located on one side of the display area AA in the second direction Y, and a pad area PA located on the side of the fan-out area AA away from the display area AA. The pad area PA may be provided with a plurality of pads, including data pads and power pads (the pads are not shown in FIG. 1). After the display panel is fabricated, the driving integrated circuit (IC for short) may be bonded to the data pads, power pads, and other pads in the pad area PA.

Figure 3:
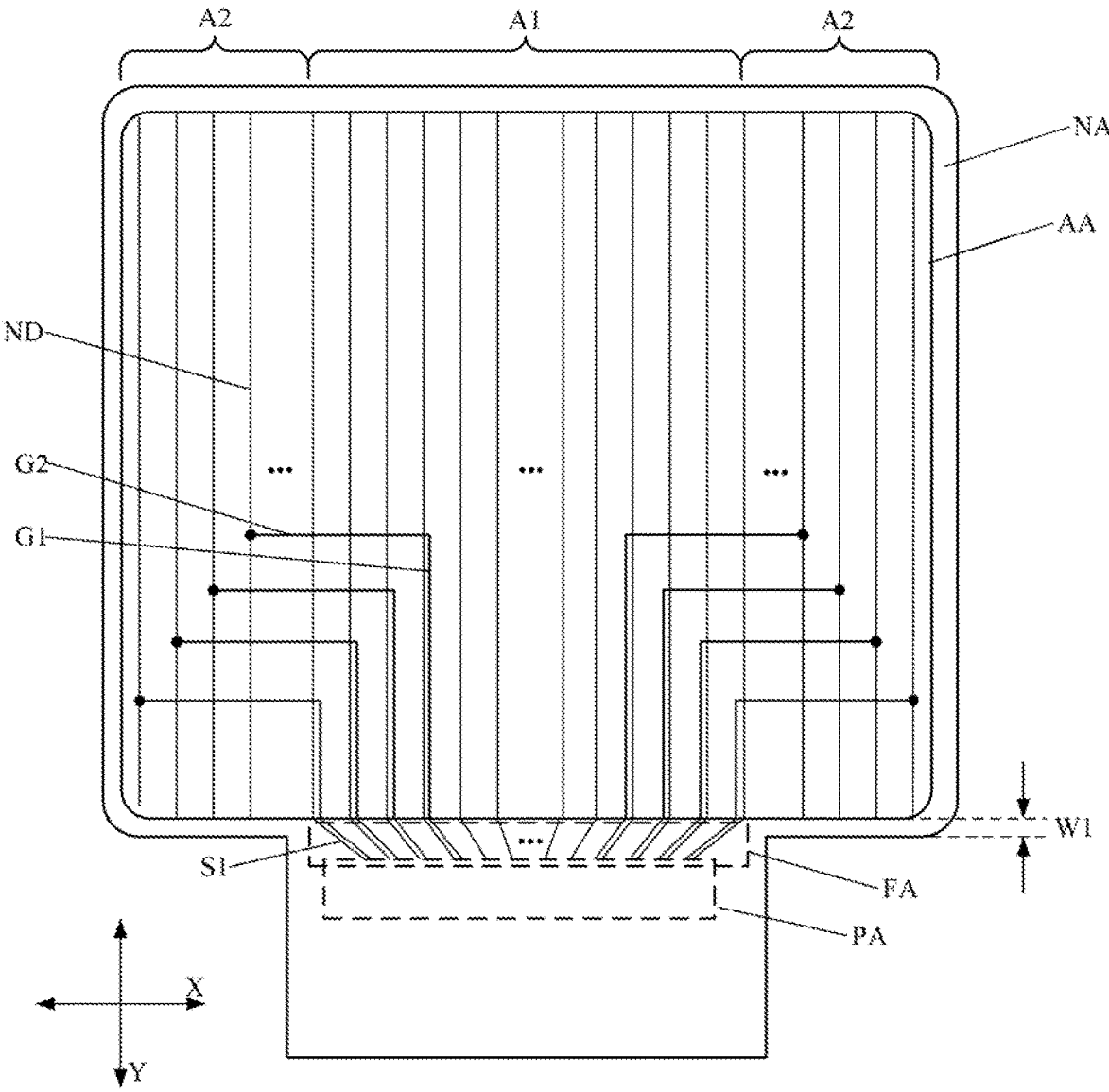
FIG. 3 is a schematic diagram of wirings for transmitting data signals in a display area AA and a fan-out area FA in an exemplary display panel according to various disclosed embodiments of the present disclosure.

For ease of understanding, FIG. 3 shows a schematic diagram of wirings for transmitting data signals in the display area AA and the fan-out area FA in a display panel according to various disclosed embodiments of the present disclosure. As shown in FIG. 3, a plurality of data signal lines ND arranged in the first direction X and extending in the second direction Y may be disposed in the display area AA, and a plurality of lead wires S1 arranged in sequence in the first direction X may be disposed in the fan-out area FA. Specifically, each lead wire S1 may extend from the pad area PA to the display area AA, and may be electrically connected to a data signal line ND corresponding to a column of pixel circuits 110 in the display area AA such that the data signal output by the driver integrated circuit IC may be transmitted to a column of pixel circuits 110 through the data pads in the pad area PA, the lead wiring S1 in the fan-out area FA and the data signal line ND in the display area AA to cause the column of pixel circuits to drive the corresponding light-emitting elements to emit light.

It should be noted that, as shown in FIG. 3, the display area AA may be divided into a central area (A1 area) and a left area and a right side area (A2 area) along the first direction X. The data signal line ND located in the central area (A1 area) of the display area AA along the first direction X may be directly electrically connected to the lead wire S1 in the corresponding fan-out area FA, and the data signal lines ND located on the left and right sides of the display area AA along the first direction X (A2 area) may also need to be electrically connected to the lead wires S1 in the fan-out area FA. In some existing display panels, the lead wire S1 in the fan-out area FA may need to be wound in the non-display area of the lower frame of the display panel to be electrically connected to the data signal lines ND on the left and right sides of the display area AA in the first direction X. Then, the lead wires S1 electrically connected to the data signal lines ND in the left and right sides of the display area AA in the first direction X will be arranged at the lower left frame position and the lower right frame position of the display panel. Accordingly, the lead wires S1 occupy a relatively large space along the first direction X, which is not conducive to narrow the lower border of the display panel.

In the FIAA display panel, as shown in FIG. 3, the data signal lines ND on the left and right sides of the display area AA in the first direction X may be connected to the lead wires S1 in the fan-out area FA and arranged in the display area AA for winding. Specifically, by adding a connection segment G1 extending in the second direction Y and a connection segment G2 extending in the first direction X in the display area AA, the lead wire S1 in the fan-out area FA may be electrically connected to the data signal lines ND on the left and right sides of the display area AA in the first direction X through the connection section G1 extending in the second direction Y in the display area AA and through the connection section G2 extending in the first direction X. Accordingly, the lead wires S1 may need to be arranged at the lower left frame and/or the lower right frame of the display panel, and a compression space may be provided for the lower frame of the display panel, which may be beneficial to realize the narrow bezel of the display panel, especially the width W1 of the lower frame of the display panel may be significantly reduced.

The implementation of FIAA connection d in this disclosure may be understood as that, by the above-mentioned means, the winding of the connection between the data signal line ND and the lead wire S1 may be performed in the display area AA to reduce the lower bezel of the display panel. Therefore, the area where the data signal line ND that needs to be wound in the display area AA and electrically connected to the lead wire S1 in the fan-out area FA may be located in the aforementioned FIAA area, such as the A2 area. The area where the data signal line ND directly and electrically connected to the lead wire S1 in the fan-out area FA without wiring may be the aforementioned non-FIAA area, i.e., the normal display area, such as the A1 area.

It should also be noted that in FIG. 1 and FIG. 3, the number of data signal lines ND in the display area AA is only for illustration, and the number of columns and rows formed by the pixel circuits 10 in FIG. 1 is also for illustration, and does not represent the actual amount. Similarly, in FIG. 3, the number of lead wires S1 in the fan-out area FA is only for illustration and does not represent the actual number.

As shown in FIG. 2, in the display panel provided by one embodiment of the present disclosure, to realize the FIAA connection, at least a portion of the column repeating units Q in the two columns of pixel circuits 110 (the P1 column of pixel circuits and the P2 column of pixel circuits) may be included with the auxiliary signal lines DV extending in the second direction Y, and the connection signal line DH extending in the first direction X may be included between at least a portion of two adjacent columns of pixel circuits 120 such that the lead wire S1 in the fan-out area FA may be electrically connected to the data signal line ND corresponding to a first column of pixel circuits 110 through the auxiliary signal line DV extending in the second direction Y and then the connection signal line DH extending in the first direction X to provide data signals for the column of pixel circuits 110. Specifically, as shown by the dotted line in FIG. 2, the wiring for connecting the data signal line ND and the lead wire S1 may be performed in the display area AA, and thus the lower bezel of the display panel may be effectively reduced.

However, as shown in FIG. 2, for the connection signal line DH connecting the auxiliary signal line DV and the data signal line ND, in fact, only a portion of the connection signal line DH between the auxiliary signal line DV and the data signal line ND may be used to connect the auxiliary signal line DV and the data signal line ND, and the portion of the connection signal line DH that is not between the auxiliary signal line DV and the data signal line ND may need to be disconnected with the portion of the connection line DH between the auxiliary signal line DV and the data signal line ND to prevent the entire connection signal line DH from transmitting data signals. Accordingly, the parasitic signal generated between the portion of the connection signal line DH that is not between the auxiliary signal line DV and the data signal line ND and the pixel circuit may be avoided. The parasitic signal may interfere with the performance of the pixel circuits.

It should be noted that FIG. 2 only shows a schematic diagram of the layout of the metal layer where the auxiliary signal line DV and the data signal line ND are located and the metal layer where the connecting signal line DH is located. In the display panel provided by each embodiment of the present disclosure, there may be many other film layers, which will not be repeated here.

Figure 4:
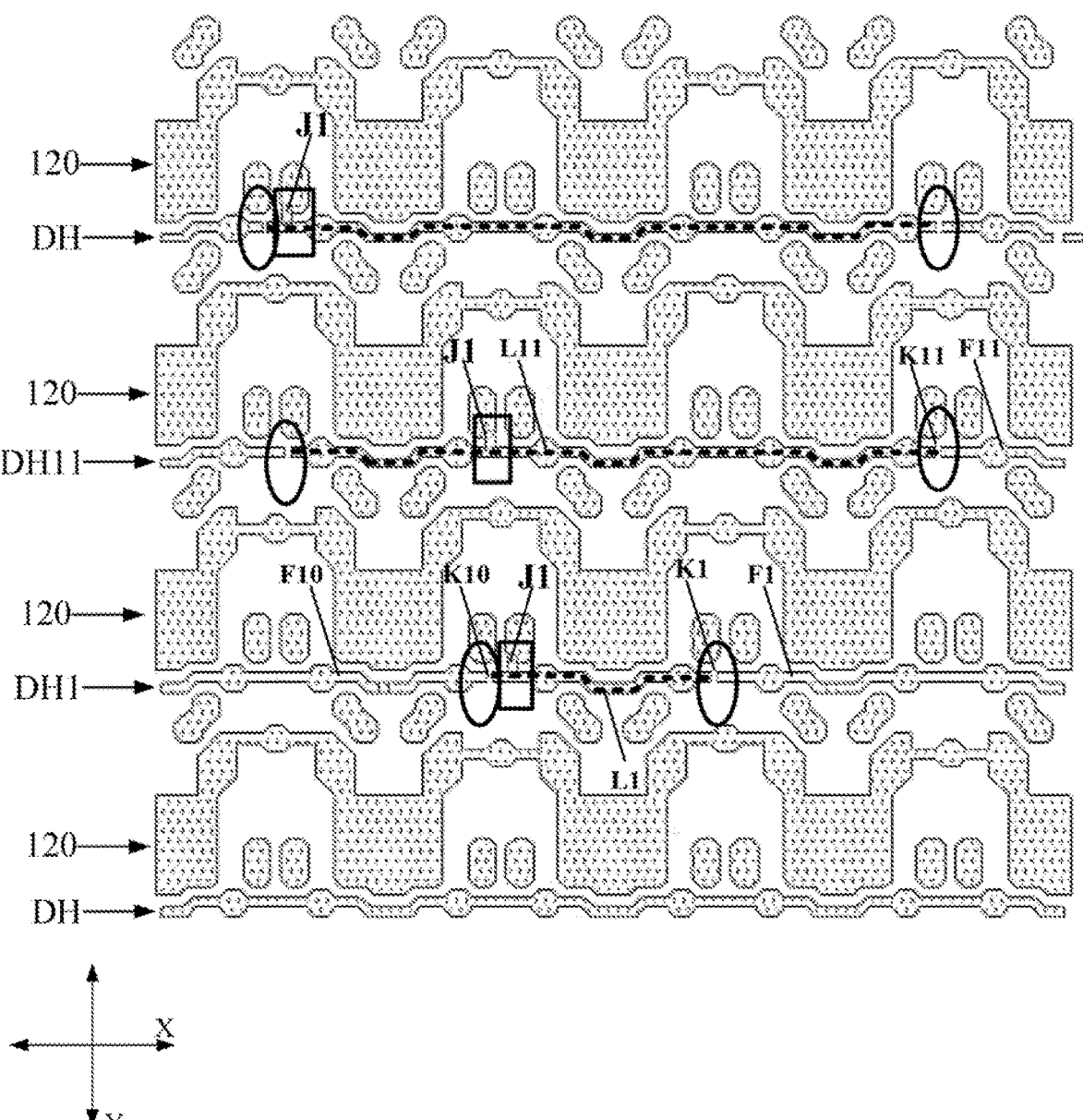
FIG. 4 is a schematic diagram of an exemplary layout of a metal layer where signal line DH is connected as shown in FIG. 2.

FIG. 4 further illustrates a schematic diagram of the layout of the metal layer where the connecting signal line DH is located in FIG. 2. As shown in FIG. 2 and FIG. 4, at least a portion of the connection signal line DH may include a connection section extending in the first direction X (marked with dotted lines) and a non-connection section. The connection section may be used to connect the auxiliary signal line DV and the data signal line ND to realize FIAA connection, and the non-connection section may not be used to connect the auxiliary signal line DV and the data signal line ND. There may be a gap between the connection section and the non-connection section such that the two sections may be disconnected, as shown in the solid ellipse box in FIG. 4.

Figure 5:
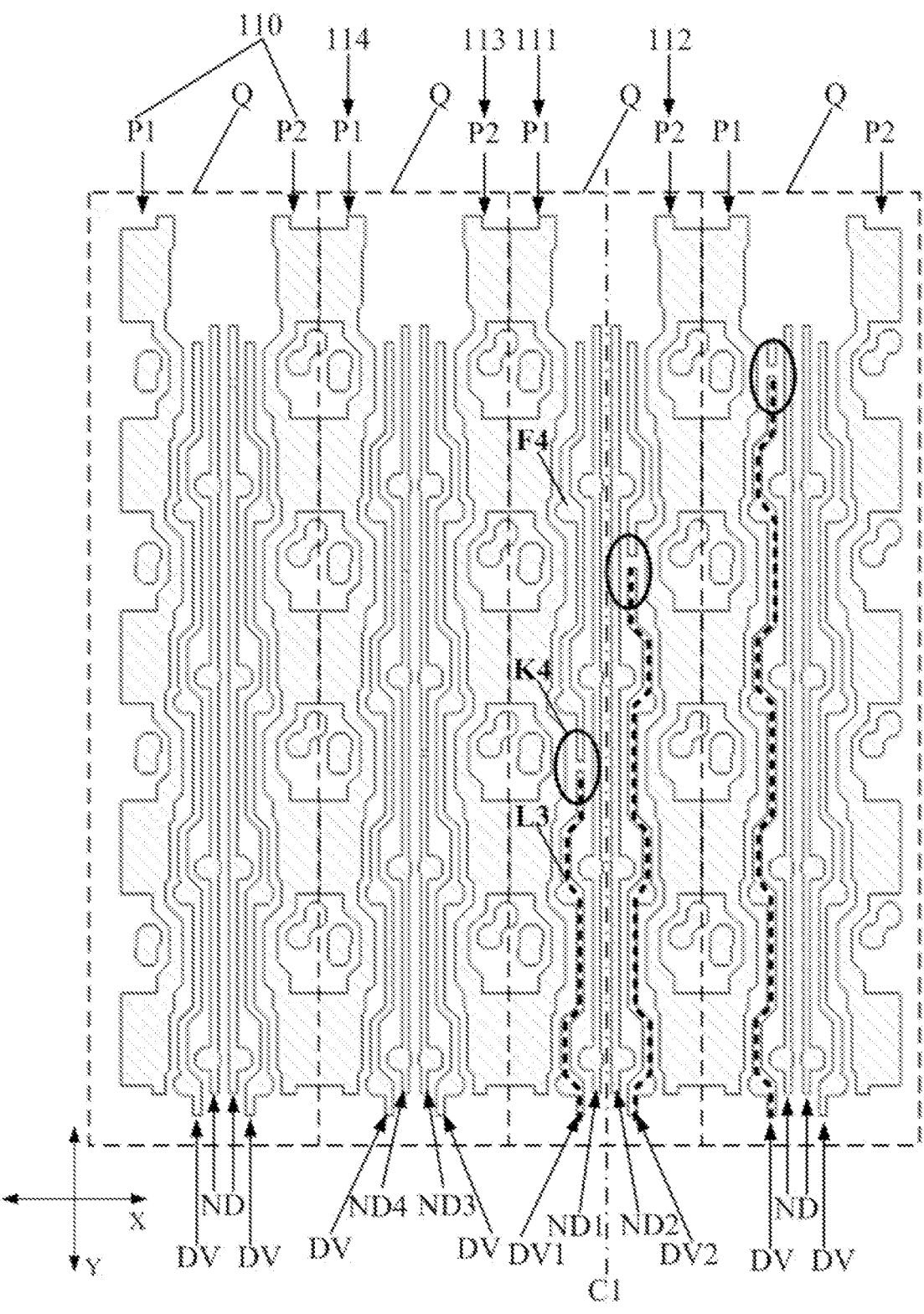
FIG. 5 is a schematic diagram of an exemplary layout of a metal layer where auxiliary signal line DV and data signal line ND are located as shown in FIG. 2.

Similarly, for the auxiliary signal line DV that implements the FIAA connection, in fact, not the entire auxiliary signal line DV is used to transmit data signals, but only a portion of the auxiliary signal line DV may be used to transmit data signals. FIG. 5 further illustrates a schematic diagram of the layout of the metal layer where the auxiliary signal line DV and the data signal line ND are located in FIG. 2. As shown in FIG. 2 and FIG. 5, at least a portion of the auxiliary signal line DV may include a connection portion (marked by dotted line in FIG. 5) and a non-connection portion. The connection portion may be used to transmit data signals, and may be electrically connected to the connection section used to transmit data signals in the connecting signal line DH, and the non-connection section may not be used to transmit data signals, there may be a gap between the connection section and the non-connection section such that that the two sections may be disconnected, as shown in the solid ellipse box in FIG. 5.

It may be seen from the above description that the area where the FIAA connection is performed in the display area AA of the display panel (FIAA area) may have the above-mentioned disconnection of the connection signal line DH and the auxiliary signal line DV, while the area where the FIAA connection is not performed in the display area AA (not FIAA area, i.e., the normal display area) may not have the disconnection of the above-mentioned connection signal line DH and auxiliary signal line DV. Therefore, there may be a difference in the metal wiring density between the FIAA area and the non-FIAA area. The light reflected by the wirings may be not uniform, which causes the visibility display unevenness (Mura) phenomenon in the dark state and the display state in the FIAA area and the non-FIAA area.

Thus, in the display panel provided by the embodiments of the present disclosure, as shown in FIG. 2, the multi-columns of pixel circuits 110 may include a first column of pixel circuits 111 and a second column of pixel circuits 112 arranged adjacently along the first direction X, and a third column of pixel circuits 113 different from the first column of pixel circuits 111 and the second column of pixel circuits 112.

As shown in FIG. 2, the first data signal line ND1 and the first auxiliary signal line DV1 extending along the second direction Y may be arranged between the first column of pixel circuits 111 and the second column of pixel circuits 112. The first auxiliary signal line DV1 may be located on the side of the first data signal line ND1 adjacent to the third column of pixel circuits 113. The first data signal line ND1 may be electrically connected to the first column of pixel circuits 111 or the second column of pixel circuits 112.

As shown by the dotted line in FIG. 2, the first auxiliary signal line DV1 may be connected to the third data signal line ND3 corresponding to third column of pixel circuits 113 through the first connection section L1 in the first connection signal line DH1 extending along the first direction X.

As shown in FIG. 2 and FIG. 4, the first connection signal line DH1 may also include a first non-connection section F1. The first non-connection section F1 may be located on the side of the first auxiliary signal line DV1 away from the first connection section L1, and there may be a first gap K1 between the first non-connection section L1 and the first non-connection section F1.

As shown in the enlarged view of the CC' rectangular area in FIG. 2 that, in the direction perpendicular to the plane where the display panel is located, the first gap K1 may be blocked by the first data signal line ND1.

In one embodiment of the present disclosure, as shown in FIG. 2, FIG. 4, and FIG. 5, the first auxiliary signal line DV1 extending in the direction Y may be disposed between the first column of pixel circuits 111 and the second column of pixel circuits 112 adjacently arranged along the first direction X. The first auxiliary signal line DV1 may be electrically connected to the third data signal line ND3 corresponding to the third column of the pixel circuits 113 through the first connection section L1 in the first connection signal line DH1 extending in the first direction X. Thus, the FIAA connection may be realized.

In one embodiment of the present disclosure, the first connection signal line DH1 may include a first connection section L1 and a first non-connection section F1. Because the first connection signal line DH1 may extend along the first direction X, the first connection section L1 and the first non-connection section F1 may also extend along the first direction X. The first connection section L1 may be connected to the first auxiliary signal line DV1 and the third data signal line ND3. The first non-connection section F1 may be located on the side of the first auxiliary signal line DV1 away from the first connection section L1, and there may be a first gap K1 between the first connection section L1 and the first non-connection segments F1. For example, in the first connection signal line DH1, only the first connection section L1 may be used to transmit data signals to the third data signal line ND3, and the first non-connection section F1 may not be used to transmit the data signal to the third data signal line ND3 to avoid parasitic signal between the pixel circuit and the first non-connection section F1 not used for transmitting the data signal in the first connection signal line DH1. The parasitic signal may interfere with the performance of the pixel circuit.

Moreover, because the first non-connection section F1 may be located on the side of the first auxiliary signal line DV1 away from the first connection section L1, the first gap K1 between the first connection section L1 and the first non-connection section F1 may be located on the side of the first auxiliary signal line DV1 away from the first connection section L1. Further, because the first auxiliary signal line DV1 may be located on the side of the first data signal line ND1 adjacent to the third column of pixel circuits 113, that is, the first data signal line ND1 may be located on the side of the first auxiliary signal line DV1 away from the third column of pixel circuits 113, the first gap K1 between the first connection section L1 and the first non-connection section F1 in the first connection signal line DH1 may be blocked by the first data signal line ND1 in a direction perpendicular to the plane where the display panel is located. Accordingly, the light reflected by the metal wiring in the FIAA area and the non-FIAA area may be relatively uniform, and the non-uniform visibility (Mura) of the FIAA area and the non-FIAA area in the display panel in the dark state and the display state may be reduced; and the display uniformity of the display panel may be improved.

It should be noted that, in the direction perpendicular to the plane where the display panel is located, the first gap K1 being blocked by the first data signal line ND1 may mean that the orthographic projection of the first gap K1 on the plane where the display panel is located may be within the range of the orthographic projection of the first data signal line ND1 on the plane where the display panel is located such that the first gap K1 may not be seen from the appearance of the display panel. In the following, in the direction perpendicular to the plane where the display panel is located, B1 being blocked by B2 may all mean that the orthographic projection of B1 on the plane where the display panel is located is within the range of the orthographic projection of B2 on the plane where the display panel is located, and will not be described further.

In addition, because both the first data signal line ND1 and the first auxiliary signal line DV1 may be located between the first column of pixel circuits 111 and the second column of pixel circuits 112, the first gap K1 in the first connection signal line DH1 may be blocked by the first data signal line ND1 such that the disconnection position of the first gap K1 in the first connection signal line DH1 may be closer to the first auxiliary signal line DV1, which may reduce the interference range of pixel circuits 112 caused by the first connection section L1 in the first connection signal line DH1.

In one embodiment of the present disclosure, as shown in FIG. 2, FIG. 4 and FIG. 5, in the column repeating units Q formed by the first column of pixel circuits 111 and the second column of pixel circuits 112, the first column of pixel circuits 111 may be located on the side of the second column of pixel circuits 112 adjacent to the third column of pixel circuits 113 in, and the first data signal line ND1 may be electrically connected to the first column of pixel circuits 111.

In another embodiment, as shown in FIG. 2, FIG. 4 and FIG. 5, the configuration that the third column of pixel circuits 113 is located on the left side of the first column of pixel circuits 111 and the second column of pixel circuits 112 as an example for illustration. In the column repetition unit Q composed of the first column of pixel circuits 111 and the second column of pixel circuits 112, the first column of pixel circuits 111 may be located on the left side, the second column of pixel circuits 112 may be located on the right side, the first data signal line ND1 and the first auxiliary signal line DV1 may all be located between the first column of pixel circuits 111 in and the second column of pixel circuits 112, and the first data signal line ND1 may be electrically connected to the first column of pixel circuits 111 on the left. The first auxiliary signal line DV1 may be located between the first data signal line ND1 and the first column of pixel circuits 111 such that the first gap K1 in the first connection signal line DH1 may be blocked by the closest data signal line, avoiding the first connection section L1 in the first connection signal line DH1 to extend away from the third column of pixel circuits 113. Accordingly, the unnecessary parasitic signal between the first connection section L1 and the pixel circuits may be avoided.

It should be noted that the above relative positions of "left" and "right" are described based on the relative positions of "left" and "right" in FIG. 2, FIG. 4 and FIG. 5. Because "left" and "right" are relative, it may be easy to obtain the situation when the third column of pixel circuits 113 is located on the right side of the first column of pixel circuits 111 and the second column of pixel circuits 112, which will not be repeated here.

It should also be noted that in FIG. 2 only marks a group of FIAA connections formed by a first auxiliary signal line DV1 and a connection signal line DH1, and only marks one column of pixel circuits 111, one second column of pixel circuits 112 and one third column of pixel circuits 113 associated with the group of FIAA. It can be understood that there may be multiple sets of FIAA connections in the display area AA of the display panel.

On the basis of the above-mentioned embodiments, in one embodiment of the present disclosure, as shown in FIG. 2, FIG. 4 and FIG. 5, a second data signal line ND2 extending along the second direction Y may be disposed between the first column of pixel circuits 111 and the second column of pixel circuits 112. The second data signal line ND2 may be located on the side of the first data signal line ND1 adjacent to the second column of pixel circuits 112. The second data signal line ND2 may be electrically connected to the second column of pixel circuits 112.

The first auxiliary signal line DV1 may be located on the side of the first data signal line ND1 and the second data signal line ND2 as a whole adjacent to the third column of pixel circuits 113.

Further, considering the uniformity of etching and the uniformity of the reflection effect of the display panel, in one embodiment of the present disclosure, as shown in FIG. 2, FIG. 4 and FIG. 5, a second auxiliary signal line DV2 extending along the second direction Y may also be disposed between the first column of pixel circuits 111 and the second column of pixel circuits 112. The second auxiliary signal line DV2 may be located on the side of the first data signal line 111 and the second data signal line 112 as a whole away from the third column of pixel circuits 113.

In one embodiment, the first auxiliary signal line DV1 may be electrically connected to the third data signal line ND3 corresponding to the third column of pixel circuits 113 through the first connection section L1 in the first connection signal line DH1 extending along the first direction X. In one embodiment, as shown in FIG. 2, FIG. 4 and FIG. 5, the second auxiliary signal line DV2 may also be connected to the fourth data signal line ND4 corresponding to the fourth column of pixel circuits 114 that is different from the first column of pixel circuits 11 and the second column of pixel circuits 112 through the connection section L11 in another connection signal line DH11 extending along the first direction X to realize the FIAA connection. At this time, the other connection signal line DH11 may also include a non-connection section F11, and the non-connection section F11 of the other connection signal line DH11 may be located on the side of the connection section L11 away from the second auxiliary signal line DV2. There may be a gap K11 between the non-connection section F11 and the connection section L11 of the other connection signal line DH11. The gap K11 may be blocked by the data signal line ND between two columns of pixel circuits in another adjacent column repeating units Q.

In another embodiment, the second auxiliary signal line DV2 may not be connected to FIAA, and at this time, the second auxiliary signal line DV2 may be connected to a constant potential. It should be noted that the constant potential may mean that the potential is a constant within a certain period of time or in a certain working state (such as a certain working brightness), and the constant potential may be different in different time periods or different working conditions (such as different working brightness).

In one embodiment, as shown in FIG. 5, there may be a first symmetrical line C1 extending along the second direction Y between the first column pixel circuits 111 and the second column of pixel circuits 112. The first column of pixel circuits 111 and the second column of pixel circuits 112 may be mirrored along the first symmetrical line C1. The first data signal line ND1 and the second data signal line ND2 may also be mirrored along the first symmetrical line C1. In addition, the first auxiliary signal line DV1 and the second auxiliary signal line DV2 may also be arranged in a mirror image along the first symmetrical line C1. In each of the above embodiments, for the connection signal line DH for the FIAA connection, specifically for the first connection signal line DH1, as shown in FIG. 2, FIG. 4 and FIG. 5, the first connection signal line DH1 may not only include the first connection section L1 for the FIAA connection and the first non-connection section F1 located on the side of the first auxiliary signal line DV1 away from the first connection section L1, but may also include the first non-connection section F1 on the side the first auxiliary signal line DV1 away from the first connection section L1. The non-connection section F10 may extend along the first direction X, and there may be a gap K10 between the non-connection section F10 and the first connection section L1, and the gap K10 may be blocked by the closest data signal line ND.

In another word, in the above-mentioned embodiments, any disconnection position (such as the gaps K1, K10 and K11, etc.) among the connection signal lines DH extending along the first direction X may be blocked by the closest data signal line ND such that the FIAA area and the non-FIAA area may not have a difference in metal wiring density due to the disconnection position in the connection signal line DH. The difference may result in the non-uniform visibility of the display panel (Mura phenomenon) in the dark state and display state. Accordingly, the display uniformity of the display panel may be improved.

On the basis of the above embodiments, in one embodiment of the present disclosure, considering the uniformity of etching and the uniformity of the reflection effect of the display panel, as shown in FIG. 2, FIG. 4 and FIG. 5, the layout of the data signal lines ND and auxiliary signal lines DV between two columns of pixel circuits in a column repeating unit Q and data signal lines and auxiliary signal lines between the first column of pixel circuits 111 and the second column of pixel circuits 112 may be same. Specifically, the multiple columns of pixel circuits 110 may include a plurality of column repeating units Q arranged along the first direction X, and the column repeating unit Q may include two columns of pixel circuits adjacently arranged along the first direction X (the P1 column of pixel circuits and the P2 columns pixel circuits).

A data signal line ND and two auxiliary signal lines DV electrically connected to each other may be arranged between the two columns of pixel circuits. For example, the data signal line ND electrically connected to the P1 column of pixel circuits, the data signal line ND electrically connected to the P2 column of pixel circuits and two auxiliary signal lines DV may be disposed between the P1 column of pixel circuits and the P2 column of pixel circuits.

There may be a symmetrical line extending along the second direction Y between the two columns of pixel circuits. For example, there may be a symmetrical line extending along the second direction Y between the P1 column of pixel circuits and the P2 column of pixel circuits, such as the symmetrical line C1 in FIG. 5.

The two columns of pixel circuits and their respective electrically connected data signal lines may be arranged in a mirror image along the symmetrical line between them. For example, the P1 column of pixel circuits and the P2 column of pixel circuits may be arranged in a mirror image along the symmetrical line between them. Further, the data signal line ND electrically connected to the P1 column of pixel circuits and the data signal line ND electrically connected to the P2 column of pixel circuits may also be mirrored along the symmetrical line between the P1 column of pixel circuits and the P2 column of pixel circuits.

The two auxiliary signal lines DV between the two columns of pixel circuits may be respectively located between a column of pixel circuits and the data signal line ND electrically connected to the column of pixel circuits, and the two auxiliary signal lines DV between the two columns of pixel circuits may also be mirrored along the symmetrical line between the them, for example, an auxiliary signal line DV between the P1 column of pixel circuits and the P2 column of pixel circuits may be located between the P1 column of pixel circuits and the data signal line ND electrically connected to the P1 column of pixel circuits, another auxiliary signal line DV may be located between the P2 column of pixel circuits and the data signal line ND electrically connected to the P2 column of pixel circuits, and these two auxiliary signal lines DV may also be symmetrical along the symmetrical line between the P1 column of pixel circuits and the P2 column of pixel circuits.

At this time, the first column of pixel circuits 111 and the second column of pixel circuits 112 may form a column repeating unit Q. The data signal lines ND may include the first data signal line ND1, the second data signal line ND2 and the third data signal line ND3. The auxiliary signal line DV may include a first auxiliary signal line DV1 and a second auxiliary signal line DV2.

In one embodiment, each column of pixel circuits may also constitute a plurality of rows of pixel circuits 120 arranged along the second direction Y. A connection signal line DH extending along the first direction X may be disposed between two adjacent rows of pixel circuits. The connection signal line DH may include a first connection signal line DH1.

In one embodiment, the layout of the data signal lines ND and the auxiliary signal lines DV between two columns of pixel circuits in each column repeating unit Q and the layout of the data signal lines and the auxiliary signal lines of the first column of pixel circuits 111 and the second column of pixel circuits 112 may be same. Such a configuration may not only make the etching of the metal layer uniform during the process of manufacturing the display panel, but also make the metal wiring density in the entire display area of the formed display panel relatively uniform. Therefore, the entire display area of the display panel may reflect light more uniformly, which may be beneficial to improving the display uniformity of the display panel.

Figure 6:
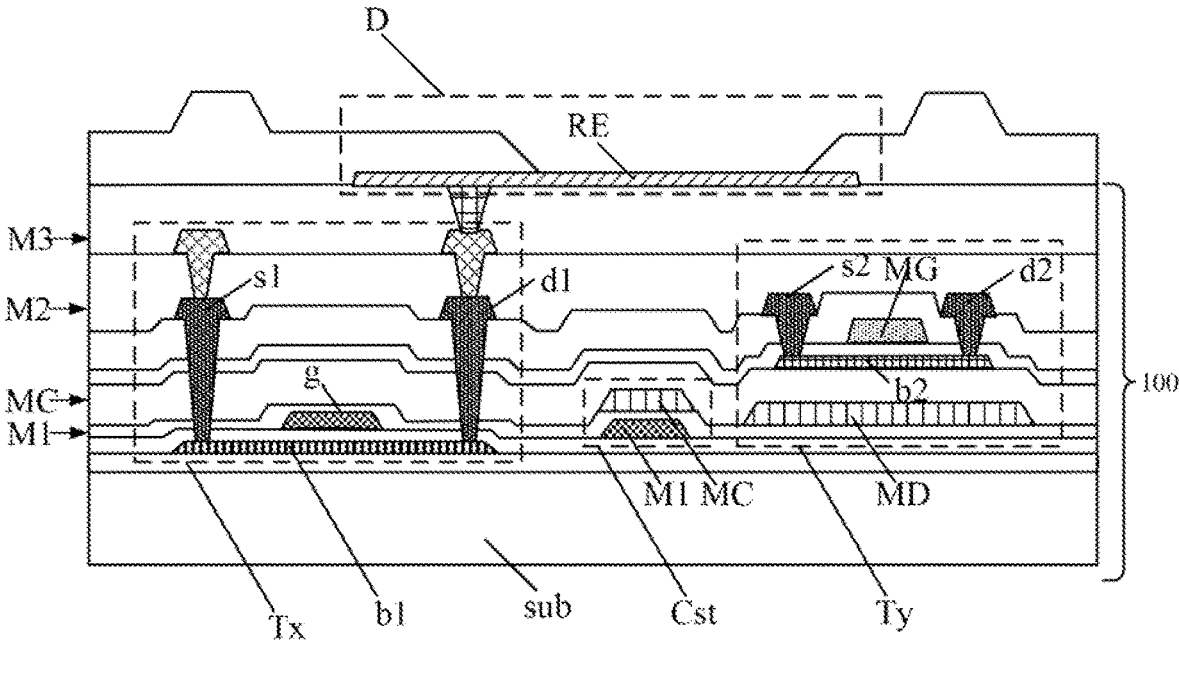
FIG. 6 is a schematic cross-sectional structure diagram of an exemplary display panel according to various disclosed embodiments of the present disclosure.

FIG. 6 shows a schematic cross-sectional view of an exemplary display panel according to various disclosed embodiments of the present disclosure. As shown in FIG. 6, the display panel may include an array substrate 100 and a plurality of light-emitting elements D located on one side of the array substrate 100. The array substrate 100 may include a substrate sub and a plurality of thin-film transistors Tx, Ty and a capacitor Cst on the substrate sub. The thin-film transistor Tx may be a low-temperature polycrystalline oxide (LTPO) thin-film transistor. The thin-film transistor Tx may include an active layer b1, a gate g, a source s1 and a drain d1. The thin-film transistor Ty may be an indium gallium zinc oxide (IGZO) thin-film transistor. The thin-film transistor Ty may include an active layer b2, a double gate (including a top gate MG and a bottom gate MD), a source s2 and a drain d2. The capacitor Cst may include a first plate M1 and a second plate MC. The light-emitting element D may include an anode layer RE, an organic light-emitting layer OM and a cathode layer SE. The organic light-emitting layer OM and the cathode SE are not shown illustrated.

As shown in FIG. 6, the metal layers M1, MC, M2, and M3 may be sequentially arranged on the side of the substrate sub along the direction away from the substrate sub. Each metal layer may be used as an electrode of a thin-film transistor or as a signal line according to different configurations. In one embodiment of the present disclosure, the auxiliary signal line DV and the data signal line ND may be located on the first metal layer M3, the connection signal line DH may be located on the second metal layer M2, and the first metal layer M3 and the second metal layer M2 may be disposed on mutually different layers.

In a direction perpendicular to the plane where the display panel is located, the overlapping area of the first auxiliary signal line DV1 and the first connection signal line DH1 may be electrically connected through the first via hole between the first metal layer M3 and the second metal layer M2 to realize the FIAA connection.

Figure 7:
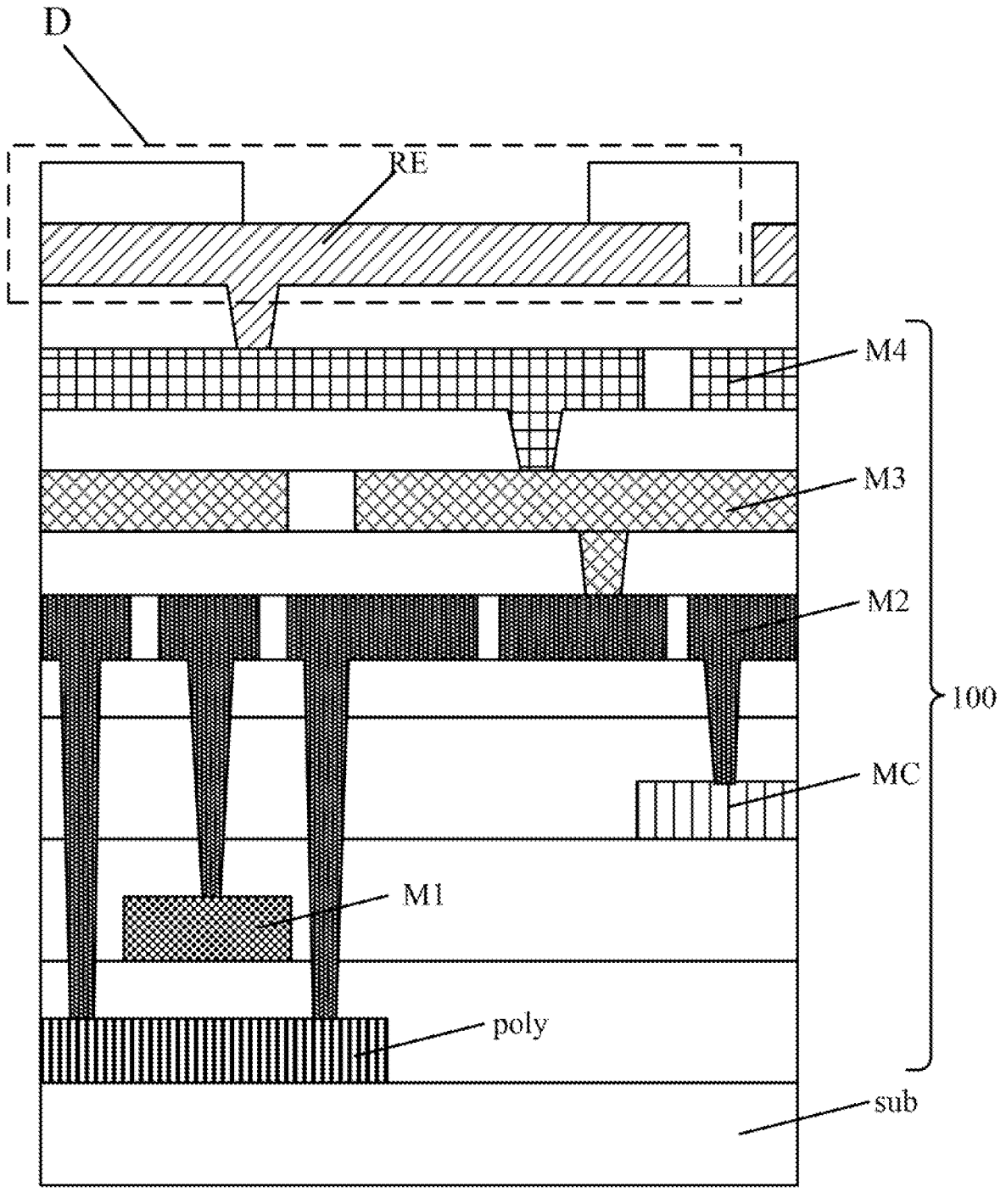
FIG. 7 is a schematic cross-sectional structure diagram of another exemplary display panel according to various disclosed embodiments of the present disclosure.

FIG. 7 shows a schematic cross-sectional view of another exemplary display panel according to various disclosed embodiments of the present disclosure. As shown in FIG. 7, the major similarity with the display panel shown in FIG. 5 may be that the display panel may also include an array substrate 100 and a plurality of light-emitting elements D on one side of the array substrate 100. The array substrate 100 may include a substrate sub and an active layer poly, metal layers M1, MC, M2, and M3 sequentially on the side of the substrate sub along a direction away from the substrate sub. The major difference from the display panel shown in FIG. 5 may be that the display panel may further include a first metal layer M4 on a side of the metal layer M3 away from the substrate sub. In one embodiment of the present disclosure, the auxiliary signal line DV and the data signal line ND may be located on the first metal layer M4, the connection signal line DH may be located on the second metal layer M3, and the first metal layer M4 and the second metal layer M3 may be mutually on different layers.

In a direction perpendicular to the plane where the display panel is located, the overlapping area of the first auxiliary signal line DV1 and the first connection signal line DH1 may be electrically connected through the first via hole between the first metal layer M4 and the second metal layer M3 to realize the FIAA connection.

It can be understood that other auxiliary signal lines except the first auxiliary signal line DV1 may not be used to transmit data signals, and the non-connection sections in the first auxiliary signal line DV1 may also not be used to transmit data signals. The non-connection sections of the auxiliary signal lines that are generally not used for transmitting the data signals may be called dummy auxiliary signal lines. Similarly, the connection signal lines that are not used to transmit the data signal at all and the non-connection section in the connection signal lines used to transmit the data signals may all be called dummy connection signal lines. The overlapping area of these dummy auxiliary signal lines and these dummy connection signal lines in the direction perpendicular to the plane where the display panel is located may be electrically connected through the first via hole between the first metal layer and the second metal layer.

Based on the above description, as shown in FIG. 5, not the entire first auxiliary signal line DV1 is used to transmit data signals, but only a portion of the first auxiliary signal line DV1 is used to transmit data signals. For example, the first auxiliary signal line DV1 may also have a disconnection position, which may cause differences in the metal wire density between the FIAA area and the non-FIAA area. The difference in the metal wire density may make the light reflected by the metal wiring uneven, resulting in visibility display unevenness (Mura) phenomenon in the FIAA area and the non-FIAA area in the dark state and the display state.

Therefore, in another embodiment of the present disclosure, as shown in FIG. 6 and FIG. 7, the display panel may further include a plurality of light-emitting elements D located on one side of the array substrate 100. A light-emitting element D may include an anode layer RE, a light-emitting layer OM and a cathode layer SE arranged sequentially in the direction away from the array substrate 100.

As shown in FIG. 2, FIG. 4 and FIG. 5, the first auxiliary signal line DV1 may include a third connection section L3 and a fourth non-connection section F4, and the third connection section L3 may be electrically connected to the first connection section L1 in the first connection signal line DH1. There may be a fourth gap K4 between the third connection section L3 and the fourth non-connection section F4. In the direction perpendicular to the plane where the display panel is located, the fourth gap K4 may be blocked by the anode layer RE.

Figure 8:
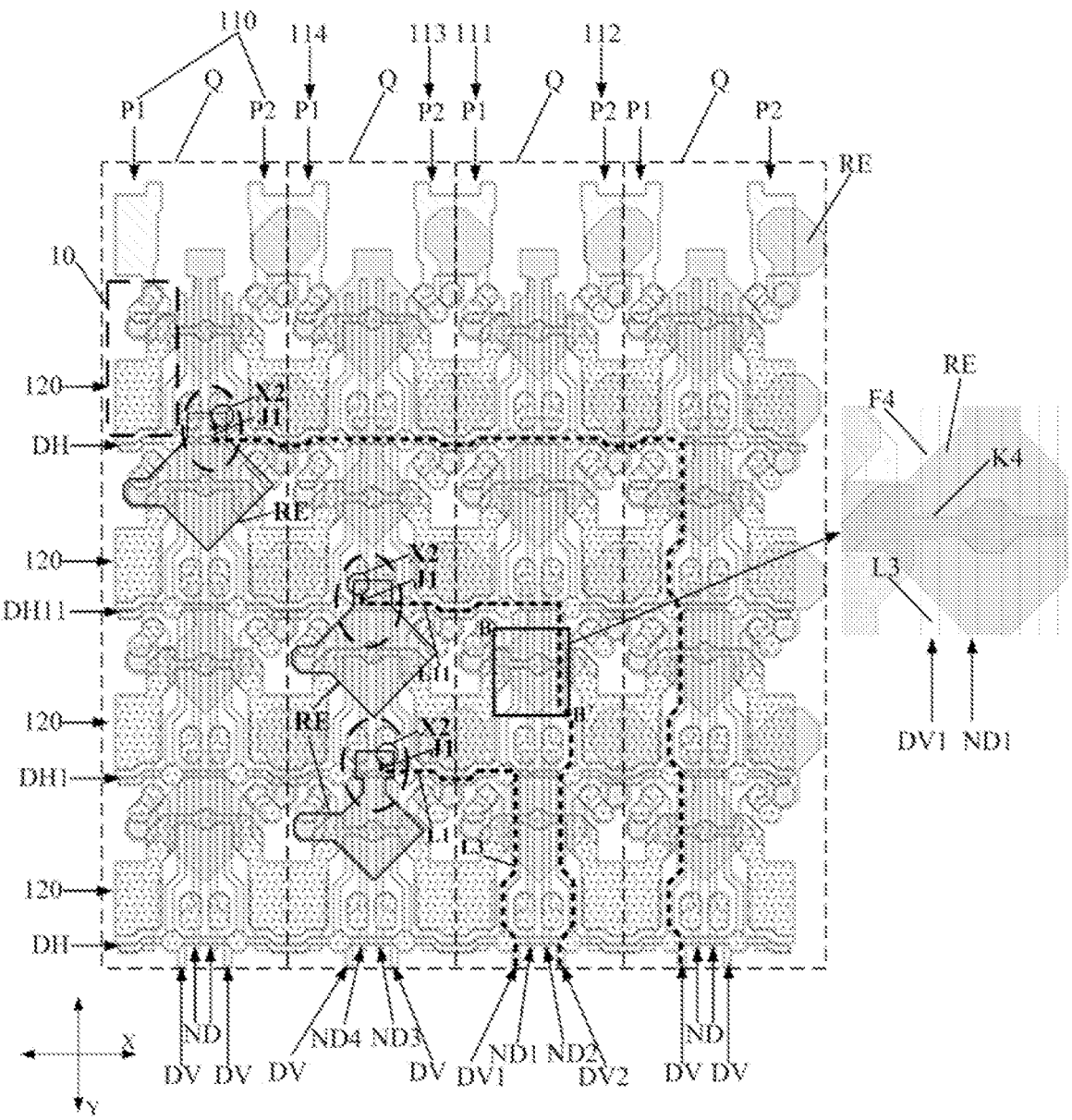
FIG. 8 is a schematic diagram of a partial layout of another exemplary display panel according to various disclosed embodiments of the present disclosure.

FIG. 8 shows a schematic diagram of a partial layout of an exemplary display panel according to various disclosed embodiments of the present disclosure. As shown in FIG. 8 on the basis of the layout shown in FIG. 2, a schematic diagram of the layout of the metal layer where the anode layer RE may be superimposed. As shown in the enlarged view of the BB' rectangle area in FIG. 8, the disconnection position (the fourth gap K4) of the first auxiliary signal line DV1 in the second direction Y may be blocked by the anode layer RE.

For example, in one embodiment, the disconnection position of the connection signal line DH extending along the first direction X may be blocked by the nearest data signal line ND, meanwhile, the broken position of the auxiliary signal line DV extending along the second direction Y may be blocked by the anode layer RE such that the light reflected by the metal wiring in the FIAA area and the non-FIAA area may be relatively uniform, and the visibility display unevenness that occurs under the dark state and the display state of the FIAA area and the non-FIAA area in the display panel may be reduced, and the display uniformity of the display panel may be improved.

On the basis of any of the above-mentioned embodiments, in one embodiment of the present disclosure, as shown in FIG. 6 and FIG. 7, the display panel may further include a plurality of light-emitting elements D located on one side of the array substrate 100. The light-emitting element D may include an anode layer RE, a light-emitting layer OM, and a cathode layer SE arranged in sequence along a direction away from the array substrate 100. The cathode layer SE may be set as a whole layer, and the cathode layer SE may be connected to a constant potential.

Among the auxiliary signal lines DV and the connection signal lines DH, the non-connection sections except the connection section electrically connected to the data signal line ND may all be electrically connected to the cathode layer SE.

Figure 9:
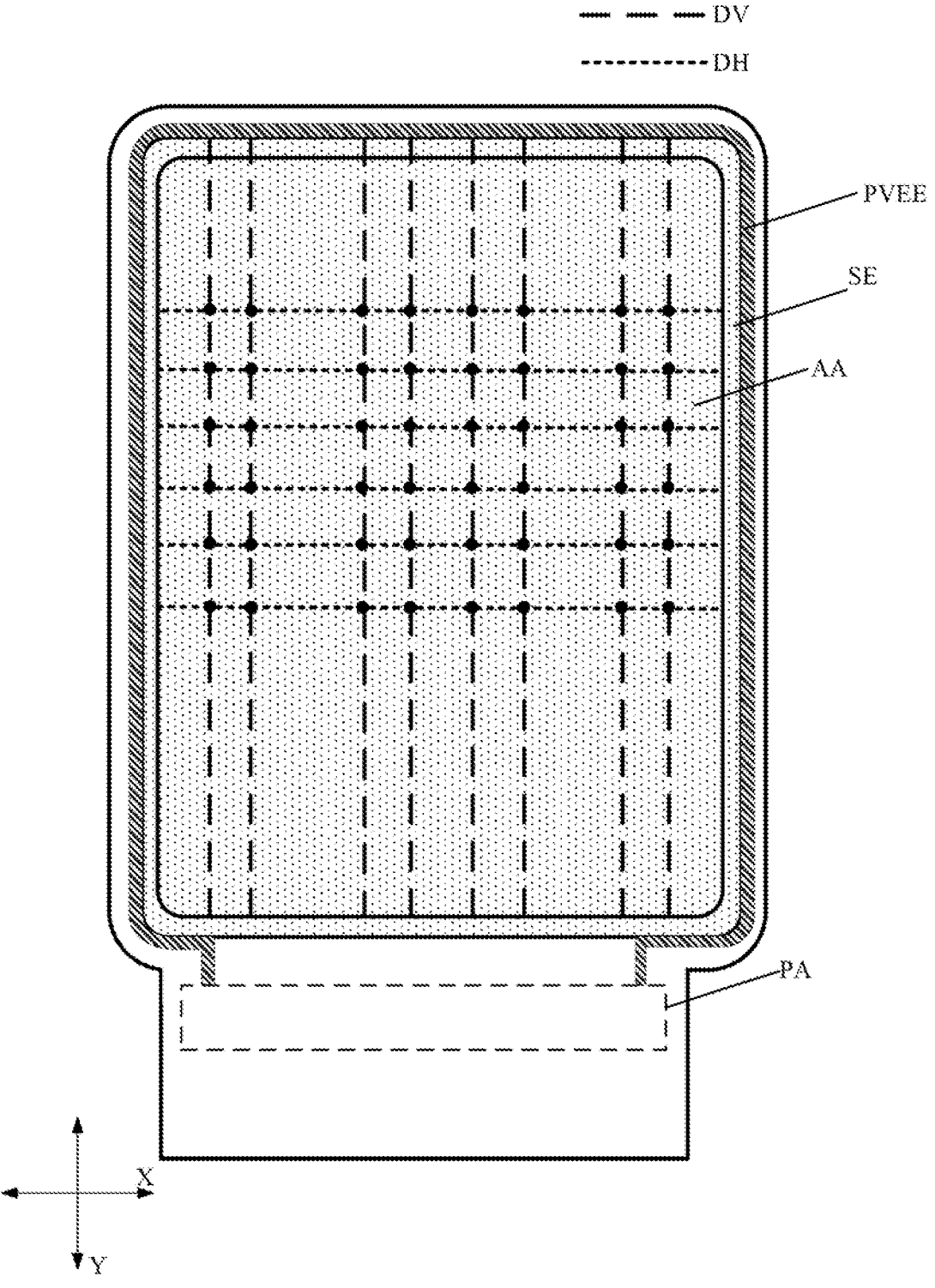
FIG. 9 is a schematic top view of an exemplary display panel according to various disclosed embodiments of the present disclosure.

FIG. 9 shows a schematic top view of an exemplary display panel according to various disclosed embodiments of the present disclosure. As shown in FIG. 9, the cathode layer SE may cover the display area AA, and the display panel may also include a first power line PVEE. The cathode layer SE may be connected to the power pad of the pad area PA through the first power supply line PVEE such that the first power signal output from the power pad of the pad area PA may be transmitted to the cathode layer SE through the first power line PVEE, and the cathode layer SE may be shared by each of the light-emitting elements D in the display area AA. The potential of the first power signal transmitted to the cathode layer SE may be a constant within a certain period of time or in a certain working state (such as a certain working brightness).

In fact, because the first power line PVEE and the cathode layer SE may have certain resistances, there may be a voltage drop (IR Drop) on the first power line PVEE and the cathode layer SE, resulting in inconsistent display brightness.

However, in the present disclosure, in each auxiliary signal line DV and each connection signal line DH, except for the connection section electrically connected to the data signal line ND, the non-connection sections may all be electrically connected to the cathode layer SE, thus, in the auxiliary signal line DV and the connection signal line DH, the non-connection sections except the connection sections electrically connected to the data signal line ND may all be connected in parallel with the cathode layer SE, which may be beneficial to reduce the resistance of the cathode layer SE such that the voltage drop in the different regions of the cathode layer SE may tend to be consistent, thereby making the voltage of the cathode layer SE in the entire display area AA tend to be consistent, which may be beneficial to improving the uniformity of display brightness of the display panel.

It should be noted that the constant potential of the cathode layer SE may mean that the potential of the first power signal connected to the cathode layer SE within a certain period of time or in a certain working state (such as a certain working brightness) may be a constant value. For example, in a certain period of time or in a certain working state (such as a certain working brightness), the potential of the first power signal may be a constant, but the first power signal may also be changed in different time periods or under different brightness.

It should also be noted that, among the auxiliary signal lines DV, the non-connection sections except the connection sections electrically connected to the data signal lines ND may include the entire auxiliary signal lines that are not used to transmit data signals, and the non-connected section in the first auxiliary signal lines not used for transmitting data signals, i.e., the dummy auxiliary signal line. Similarly, the non-connection section in each connection signal line DH except the connection section electrically connected to the data signal line ND may include the entire connection signal line not used to transmit data signals, and the non-connection section other than the connection section used to transmit data signals in the connection signal line, i.e., the dummy connection signal line.

In another embodiment of the present disclosure, the non-connection section of each auxiliary signal line DV and the non-connection section of each connection signal line DH may also be directly electrically connected to the first power line PVEE, and at this time also connected with the first power signal, that is, it may equivalent to that the non-connection section of each auxiliary signal line DV and each connection signal line DH may be connected in parallel with the first power line PVEE, which may be beneficial to reduce the resistance on the first power line PVEE, and may also improve the uniformity of the brightness of the display panel.

In the above two embodiments, the non-connection sections of each auxiliary signal line DV and each connection signal line DH may be connected to the first power supply signal of a constant potential, but this disclosure does not limit this. For example, in other implementations of this disclosure, these non-connection sections may also be connected to other constant potential signals.

In one embodiment of the present disclosure, the display panel may further include a plurality of second power lines PVDD. The second power lines PVDD may be located in the display area AA and may extend along the second direction Y. The second power lines PVDD may be electrically connected to and the anode layer RE of the light-emitting elements D and may be configured to transmit second power signals to the light-emitting elements D. The second power signal may also be a constant potential signal, that is, the potential within a certain period of time or in a certain working state (such as a certain working brightness) may be a constant.

In one embodiment, each auxiliary signal line DV and the non-connection section of each connection signal line DH may be electrically connected to the second power line PVDD in the display area AA to access the second power signal with a constant potential. Specifically, as shown in FIG. 6 and FIG. 7, the second power supply line PVDD may be located in the metal layer M2, and the non-connection section in each auxiliary signal line DV and each connection signal line DH may be electrically connected to the second power line PVDD through the via hole between different metal layers.

In another embodiment, the non-connection sections of each auxiliary signal line DV and each connection signal line DH may also be partially connected to the first power signal and partially connected to the second power signal, depending on the specific circumstances.

Figure 10:
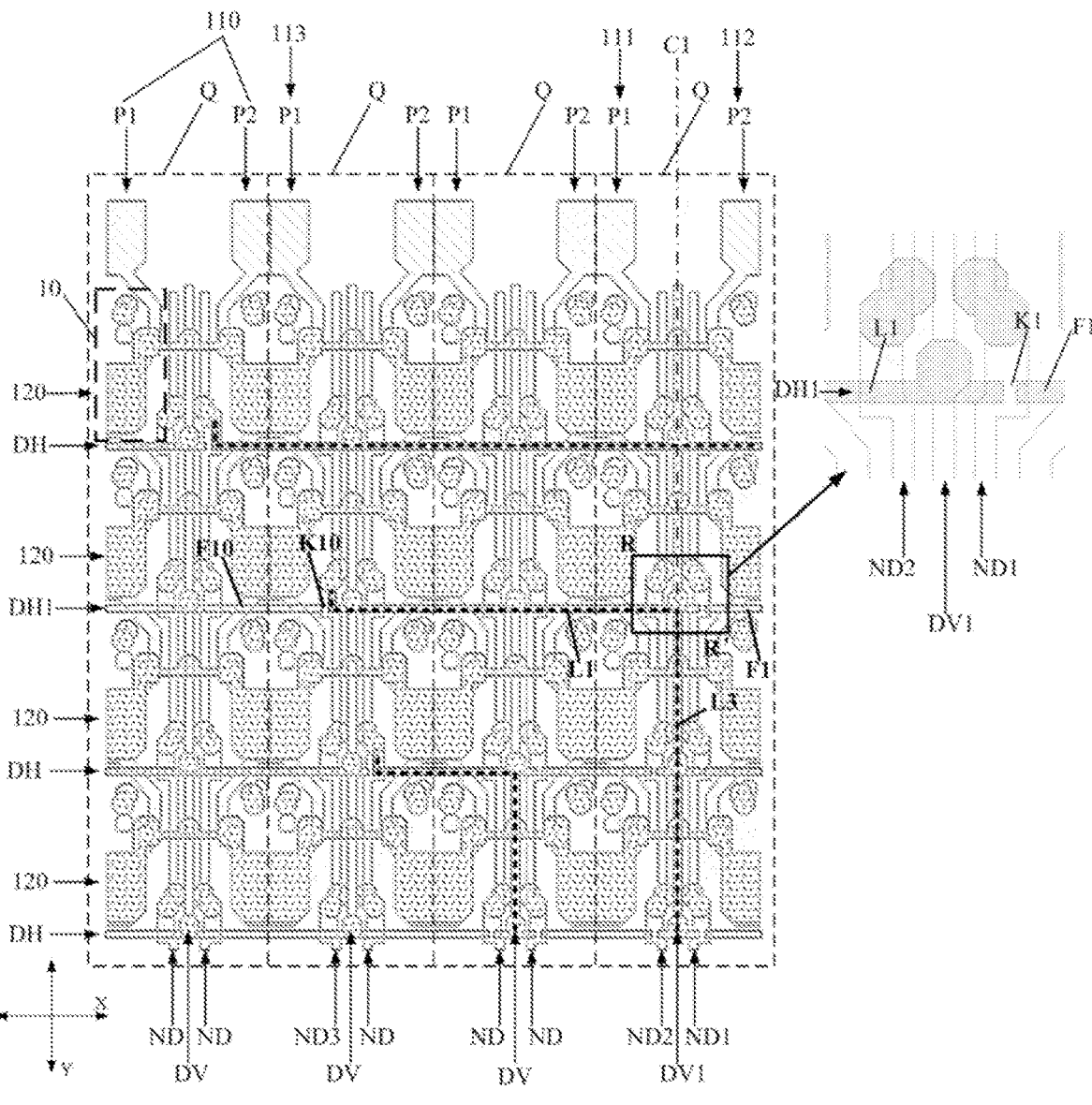
FIG. 10 is a schematic diagram of a partial layout of another exemplary display panel according to various disclosed embodiments of the present disclosure.

FIG. 10 shows a schematic partial layout of another exemplary display panel according to various disclosed embodiments of the present disclosure. In combination with FIG. 1 and FIG. 10, the display panel may include an array substrate 100. The array substrate 100 may include multiple columns of pixel circuits 110 extending along the second direction Y. The first direction X may intersect the second direction Y.

As shown in FIG. 10, the multiple columns of pixel circuits 110 in the array substrate 100 may include a first column of pixel circuits 111 and a second column of pixel circuits 112 adjacently arranged along the first direction X, and a third column of pixel circuits 113 different from the first column of pixel circuits 111 and the second column of pixel circuits 112.

As shown in FIG. 10, the first data signal line ND1 and the first auxiliary signal line DV1 extending along the second direction Y may be arranged between the first column of pixel circuits 111 of and the second column of pixel circuits 112. The first auxiliary signal line DV1 may be located on the side of the first data signal line ND1 adjacent to the third column of pixel circuits 113. The first data signal line ND1 may be electrically connected to the first column of pixel circuits 111 or the second column of pixel circuits 112.

As shown by the dotted line in FIG. 10, the first auxiliary signal line DV1 may be electrically connected to the third data signal line ND3 corresponding to the third column of pixel circuits 113 through the first connection section L1 in the first connection signal line DH1 extending along the first direction X.

As shown in FIG. 10, the first connection signal line DH1 may further include a first non-connection section F1. The first non-connection section F1 may be located on the side of the first auxiliary signal line DV1 away from the first connection section L1. There may be a first gap K1 between the first connection section L1 and the first non-connection section F1.

It can be seen from the enlarged view of the RR'-rectangular area in FIG. 10 that, in the direction perpendicular to the plane where the display panel is located, the first gap K1 may be blocked by the first data signal line ND1.

It should be noted that FIG. 10 only shows a layout diagram of the metal layer where the auxiliary signal line DV and the data signal line ND are located and the metal layer where the connection signal line DH is located. In the display panel provided by each embodiment of the present disclosure, there may be many other film layers, which will not be repeated here.

In one embodiment of the present disclosure, as shown in FIG. 10, the auxiliary signal line DV1 extending along the second direction Y may be disposed between the first column of pixel circuits 111 and the second column of pixel circuits 112, the first auxiliary signal line DV1 may be electrically connected to the third data signal line ND3 corresponding to the third column of pixel circuits 113 through the first connection section L1 in the first connection signal line DH1 extending along the first direction X to achieve the FIAA connection.

In one embodiment of the present disclosure, the first connection signal line DH1 may include a first connection section L1 and a first non-connection section F1. Because the first connection signal line DH1 may extend along the first direction X, the first connection section L1 and the first non-connection section F1 may also extend along the first direction X. The first connection section L1 may be connected to the first auxiliary signal line DV1 and the third data signal line ND3, the first non-connection section F1 may be located on the side of the first auxiliary signal line DV1 away from the first connection section L1, and there may be a first gap K1 between the first connection section L1 and the first non-connection section F1, that is, in the first connection signal line DH1, only the first connection section L1 may be configured to transmit data signals to the third data signal line ND3, and the first non-connection section F1 may not be used for transmitting the data signal to the third data signal line ND3 to avoid the parasitic signal between the pixel circuits and the first non-connection section F1 that is not configured for data signal transmission in the first connection signal line DH1. The parasitic signal may interfere with the performance of the pixel circuits.

Moreover, because the first non-connection section F1 may be located on the side of the first auxiliary signal line DV1 away from the first connection section L1, the first gap K1 between the first connection section L1 and the first non-connection section F1 may be located on the side of the first auxiliary signal line DV1 away from the first connection section L1, and because the first auxiliary signal line DV1 may be located on the side of the first data signal line ND1 adjacent to the third column of pixel circuits 113, that is, the first data signal line ND1 may be located on the side of the first auxiliary signal line DV1 away from the third column of pixel circuits 113, the first gap K1 between the first connection section L1 and the first non-connection section F1 in the first connection signal line DH1 may be blocked by the first data signal line ND1 in a direction perpendicular to the plane where the display panel is located. Accordingly, the light reflected by the metal wiring in the FIAA area and the non-FIAA area may be relatively uniform, and the non-uniform display phenomenon of the FIAA area and the non-FIAA area in the display panel in the dark state and the display state may be reduced; and the display uniformity of the display panel may be improved.

In addition, because both the first data signal line ND1 and the first auxiliary signal line DV1 may be located between the first column of pixel circuits 111 and the second column of pixel circuits 112, the first gap K1 in the first connection signal line DH1 may be blocked by the first data signal line ND1, the disconnection position of the first gap K1 in the first connection signal line DH1 may be closer to the first auxiliary signal line DV1, which may reduce interference range of pixel circuits affected by the first connection section L1 in the first connection signal line DH1.

In one embodiment of the present disclosure, as shown in FIG. 10, the first column of pixel circuits 111 may be located on the side of the second column of pixel circuits 112 adjacent to the third column of pixel circuits 111. The first data signal line ND1 may be electrically connected to the second column of pixel circuits 112.

In one embodiment, as shown in FIG. 10, the configuration that the third column of pixel circuits 113 is located on the left side of the first column of pixel circuits 111 and the second column of pixel circuits 112 is used as an example. At this time, the first column of pixel circuits 111 may be on the left side, the second column of pixel circuits 112 may be on the right side, the first data signal line ND1 and the first auxiliary signal line DV1 may be both located between the first column of pixel circuits 111 and the second column of pixel circuits 112, and the first data signal line ND1 may be electrically connected to the second column of pixel circuits 112 on the right. The first auxiliary signal line DV1 may be located between the first data signal line ND1 and the first column of pixel circuits 111, thus the first gap K1 in first connection signal line DH1 may be blocked by the closest data signal line to prevent the first connection section L1 in the first connection signal line DH1 from extending away from the third column of pixel circuits 113, and reducing unnecessary parasitic signal between the first connection section L1 and the pixel circuits.

It should be noted that the above relative positions of "left" and "right" are described based on the relative positions of "left" and "right" in FIG. 10. Because "left" and "right" are relative, it may be easy to obtain the situation when the third column of pixel circuits 113 are located on the right side of the first column of pixel circuits 111 and the second column of pixel circuits 112, and details will not be repeated here.

It should also be noted that only one group of FIAA connections formed by a first auxiliary signal line DV1 and a connection signal line DH1 are marked in FIG. 10, and only one group of first column of pixel circuits 111, second column of pixel circuits 112 and third column of pixel circuits 113 associated with the group of FIAA connections are marked. It can be understood that there may be multiple sets of FIAA connections in the display area AA of the display panel.

On the basis of the above-mentioned embodiments, in another embodiment of the present disclosure, as shown in FIG. 10, a second data signal line ND2 extending along the second direction Y may be disposed between the first column of pixel circuits 11 and the second column of pixel circuits 112. The second data signal line ND2 may be located on a side of the first data signal line ND1 adjacent to the first column of pixel circuits 111. The second data signal line ND2 may be electrically connected to the first column of pixel circuits 111. The first auxiliary signal line DV1 may be located between the first data signal line ND1 and the second data signal line ND2.

It should be noted that, in the display panel shown in FIG. 2, between the first column of pixel circuits 111 and the second column of pixel circuits 112, the first auxiliary signal line DV1 may be located on a side of the first data signal line ND1 and the second data signal line ND2 as a whole adjacent to the third column of pixel circuits 113. At this time, it may be usually necessary to set the second auxiliary signal line DV2 on the side of the first data signal line ND1 and the second data signal line ND2 as a whole away from the third column of pixel circuits 113 to ensure the uniformity of etching and the uniformity of the reflection effect of the display panel. However, at this time, two data signal lines and two auxiliary signal lines may be arranged between the first column of pixel circuits 111 and the second column of pixel circuits 112. As a result, the density of metal wiring in the display area of the display panel may be relatively high. Thus, under a same pixel density unit (PPI), the transmittance of the FIAA display panel may be lower than that of the non-FIAA display panel and, when the arrangement of the data signal line ND and the auxiliary signal line DV between two adjacent columns of pixel circuits in any column repeating unit Q and the arrangements of the auxiliary signal lines ND and the data signal lines DV between the first column of pixel circuits 111 and the second column of pixel circuits 112 are same, each auxiliary signal line and each connection signal line may also be likely to generate parasitic signals on the pixel circuit, which may affect the performance of the pixel circuit and further affect the display effect of the display panel.

In the display panel provided by this disclosure, as shown in FIG. 10, between the first column of pixel circuits 111 and the second column of pixel circuits 112, the first auxiliary signal line DV1 may be located between the first data signal line ND1 and the second data signal line ND2 such that only one first auxiliary signal line DV1 may be arranged between the first column of pixel circuits 111 and the second column of pixel circuits 112, when the arrangement of the data signal lines ND and the auxiliary signal lines DV between two adjacent columns of pixel circuits in any column repeating unit Q is same as the arrangement of the data signal lines and the auxiliary signal lines between first column of pixel circuits 111 and the second column of pixel circuits 112, the number of auxiliary signal lines DV in the display area of the display panel may be significantly reduced, and the transmittance of the display panel may be significantly improved. Further, the influence of the auxiliary signal line DV on the generation of parasitic signal in the pixel circuits may also be reduced, and the display effect of the display panel may be improved.

In another embodiment of the present disclosure, according to actual needs, a second auxiliary signal line DV2 extending along the second direction Y may also be provided between the first column of pixel circuits 111 and the second column of pixel circuits 112. In such a configuration, the second auxiliary signal line DV2 may also be located between the first data signal line ND1 and the second data signal line ND2.

In one embodiment of the present disclosure, as shown in FIG. 10, the first column of pixel circuits 111 and the second column of pixel circuits 112 may be arranged in a mirror image along the first symmetrical line C1, and the first data signal line ND1 and the second data signal line ND1 may be arranged in a mirror image along the first symmetrical line C1. The first auxiliary signal line DV1 may be located on the first symmetrical line C1.

In such a configuration, the first column of pixel circuits 111 and the second column pixel circuits 112 may be arranged in a mirror image along the first symmetrical line C1 extending along the second direction Y between them such that, between the first column of pixel circuits 111 and the second column of pixel circuits 112, the first data signal line ND1 electrically connected to the first column of pixel circuits 111 and the second data signal line ND1 electrically connected to the second column of pixel circuits 112 may be mirrored along the first symmetrical line C1 and the first auxiliary signal line DV1 may be located on the first symmetrical line C1.

In this embodiment, when the arrangement of the data signal line ND and the auxiliary signal line DV between two adjacent columns of pixel circuits in any column repeating unit Q and the arrangement of the data signal lines and auxiliary signal lines between the first column pixel circuit 111 and the second column pixel circuit 112 are same, the number of auxiliary signal lines DV in the display area AA of the display panel may be greatly reduced, thereby significantly improving the transmittance of the display panel. Further, the influence of the auxiliary signal line DV on the generation of the parasitic signal in the pixel circuits may be reduced and the display effect of the display panel may be improved. Further, the arrangement of the pixel circuits of each column and the data signal lines and auxiliary signal lines between the adjacent pixel circuits may be made neat in the display area of the display panel, and the unify layout may be easy to achieve.

In particular, for a display panel with a high pixel density unit (PPI), the distance between two adjacent columns of pixel circuits in a column repeating unit Q may be relatively small, and only the design provided in this embodiment, in which an auxiliary signal line may be arranged between two adjacent columns of pixel circuits in the column repeating unit Q, and the auxiliary signal line is located on the mirror symmetrical line of the two adjacent columns of pixel circuits, may be used, otherwise the FIAA connection may not be realized.

In the above embodiments, for the connection signal line DH for the FIAA connection, specifically the first connection signal line DH1, as shown in FIG. 10, the first connection signal line DH1 may not only include the first connection section L1 and the first non-connection section F1 located on the side of the first auxiliary signal line DV1 away from the first connection section L1, may also include a non-connection section F10 located on the side of the first connected section L1 away from the first non-connection section F1. The non-connection section F10 may extend along the first direction X, and there may be a gap K10 between the non-connection section F10 and the first connection section L1. The gap K10 may be blocked by the nearest data signal line ND.

That is to say, in the above-mentioned embodiments, any disconnection position (such as the gap K1, or K10, etc.) in the connection signal line DH extending along the first direction X may be blocked by the nearest data signal line ND such that the FIAA area and the non-FIAA area may not have a difference in metal wiring density due to the disconnection positions in the connection signal line DH, the difference in the metal wiring density may result in uneven visibility phenomenon (Mura) of the display panel in the dark state and display state. Thus, the display uniformity of the display panel may be improved.

On the basis of the above-mentioned embodiments, in one embodiment of the present disclosure, considering the uniformity of etching and the uniformity of the reflection effect of the display panel, as shown in FIG. 10, the multiple driving circuits may include the plurality of column repeating units Q arranged in the first direction X. The plurality of column repeating unit Q may include two columns of pixel circuits (P1 column of pixel circuits and P2 column of pixel circuits) adjacently arranged along the first direction X.

A data signal line ND and an auxiliary signal line DV respectively electrically connected to the two columns of pixel circuits may be disposed between the two columns of pixel circuits (P1 column of pixel circuits and P2 column of pixel circuits). That is, a data signal line ND electrically connected to the P1 column of pixel circuits, a data signal line ND electrically connected to the P2 column of pixel circuits, and two auxiliary signal lines DV may be disposed between the P1 column of pixel circuits and P2 column of pixel circuits.

There may be a symmetrical line extending along the second direction Y between the two columns of pixel circuits (P1 column of pixel circuits and P2 column of pixel circuits), that is, there may be a symmetrical line extending along the second direction Y between the P1 column of pixel circuits and the P2 column of pixel circuits, such as the symmetrical line C1 in FIG. 10.

The two columns of pixel circuits and their respective electrically connected data signal lines ND may be arranged in a mirror image along the symmetrical line between them. That is, the P1 column of pixel circuits and the P2 column of pixel circuits may be arranged in a mirror image along the symmetrical line between them, and the data signal line ND electrically connected to the P2 column of pixel circuits and the data signal line ND electrically connected to the P1 column of pixel circuits may also be mirrored along the symmetrical line between the P1 column of pixel circuits and the P2 column of pixel circuits.

The auxiliary signal line DV between the two columns of pixel circuits may be located on the symmetrical line between them. That is, the auxiliary signal line DV between the P1 column of pixel circuits and the P2 column of pixel circuits may be located on the symmetrical line between the P1 column of pixel circuits and the P2 column of pixel circuits.

The first column of pixel circuits 111 and the second column of pixel circuits 112 may form a column repeating unit Q. The data signal line ND may include the first data signal line ND1, the second data signal line ND2 and the third data signal line ND3, and the auxiliary signal line DV may include a first auxiliary signal line DV1.

Each column of pixel circuits 110 may also constitute a plurality of rows of pixel circuits 120 arranged along the second direction Y, and a connection signal line DH extending along the first direction X may be arranged between two adjacent rows of pixel circuits. The connection signal line DH may include a first connection signal line DH1.

In one embodiment, the arrangement of the data signal lines ND and the auxiliary signal lines DV between two columns of pixel circuits in each column repeating unit Q and the arrangement of data signal lines and the auxiliary signal lines between the first column of pixel circuits 111 and the second column of pixel circuits 112 may be same, which may not only make the etching of the metal layer uniform during the process of manufacturing the display panel, but also make the metal wiring density in the entire display area of the formed display panel relatively uniform. Therefore, the entire display area of the display panel may reflect light more uniformly, which may be beneficial to improving the display uniformity of the display panel.

As described above, in the display panel shown in FIG. 2, the auxiliary signal line DV and the data signal line ND may be located on the first metal layer, and the connection signal line DH may be located on the second metal layer. Then, to realize the FIAA connection, in the FIAA area, only the position where the auxiliary signal line DV is connected to the signal line DH may need to be connected through the first via hole between the first metal layer and the second metal layer, but in the non-FIAA area, each auxiliary signal line DV and the overlapping areas of the connection signal lines DH in the direction perpendicular to the display panel may be connected through the first via hole between the first metal layer and the second metal layer, thereby forming a regular grid-like arrangement. Among each auxiliary signal line DV and each connection signal line DH, the non-connection sections except the connection sections electrically connected to the data signal lines ND may all be connected to a constant potential to prevent the parasitic signal interference to the pixel circuit.

It can be seen that, in the display panel shown in FIG. 2, the via holes between the auxiliary signal line DV and the connection signal line DH in the FIAA area may be irregular, and they may be different from the via holes between the auxiliary signal line DV and the connection signal line in the non-FIAA area. The irregular distribution of the via holes in the FIAA area may also cause the uneven visibility phenomenon (Mura) of the display panel in the dark state and in the display state.

Thus, in one embodiment of the present disclosure, as shown in FIG. 6 and FIG. 10, the auxiliary signal line DV and the data signal line ND may be disposed on the first metal layer M3, the first metal layer M3 and the second metal layer M2 may be arranged in different layers.

In a direction perpendicular to the plane where the display panel is located, the overlapping area of the auxiliary signal line DV and the connection signal line DH may be electrically connected through the first via hole between the first metal layer M3 and the second metal layer M2.

In another embodiment of the present disclosure, as shown in FIG. 7 and FIG. 10, the auxiliary signal line DV and the data signal line ND may be located on the first metal layer M4, and the connection signal line DH may be located on the second metal layer M3. The first metal layer M4 and the second metal layer M3 may be arranged in different layers.

In a direction perpendicular to the plane where the display panel is located, the overlapping area of the first auxiliary signal line DV1 and the first connection signal line DH1 may be electrically connected through the first via hole between the first metal layer M4 and the second metal layer M3 to realize the FIAA connection.

Figure 11:
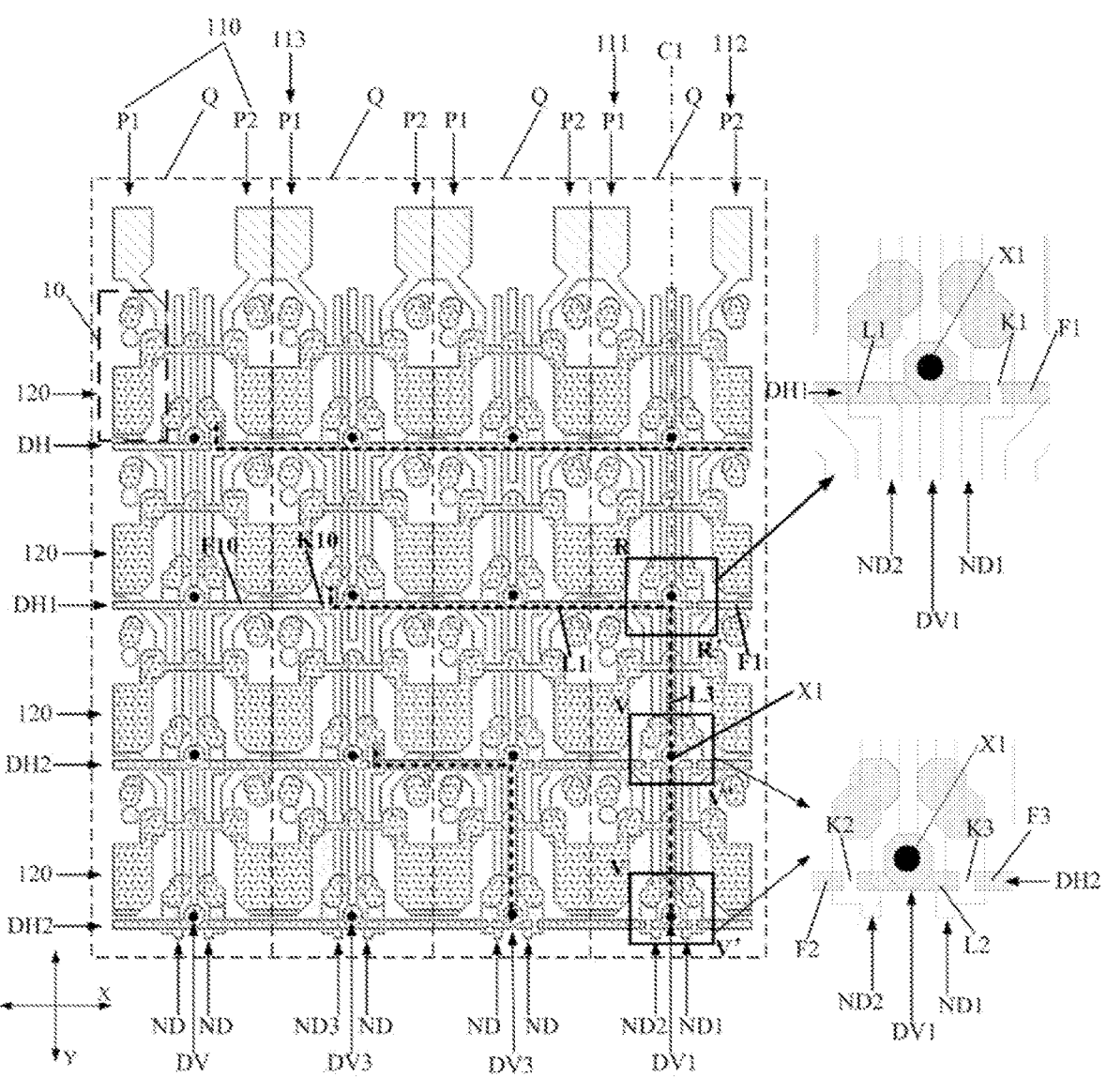
FIG. 11 is a schematic diagram of a partial layout of another exemplary display panel according to various disclosed embodiments of the present disclosure.
Figure 12:
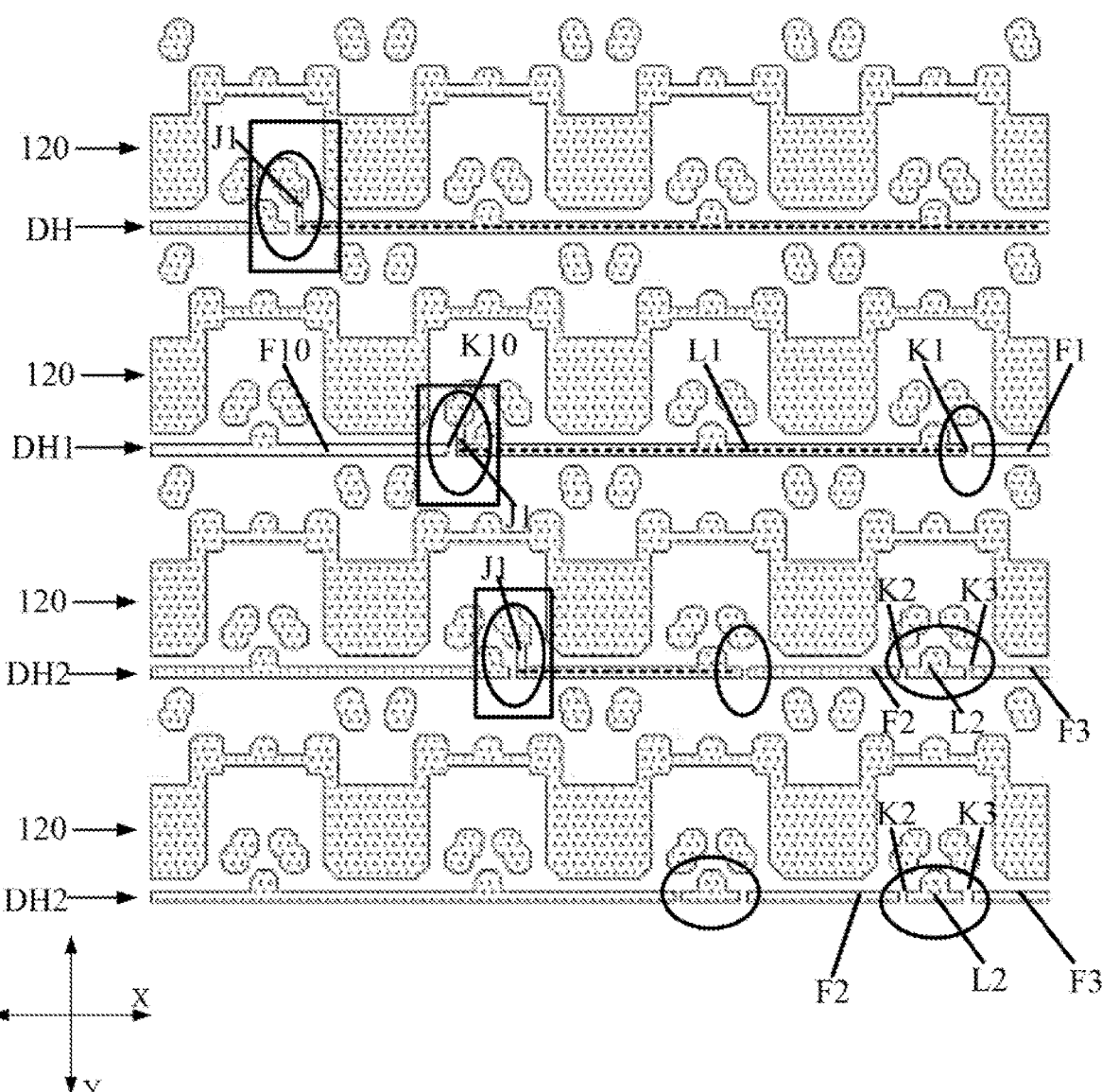
FIG. 12 is a schematic diagram of an exemplary layout of a metal layer where signal line DH is connected as shown in FIG. 11.
Figure 13:
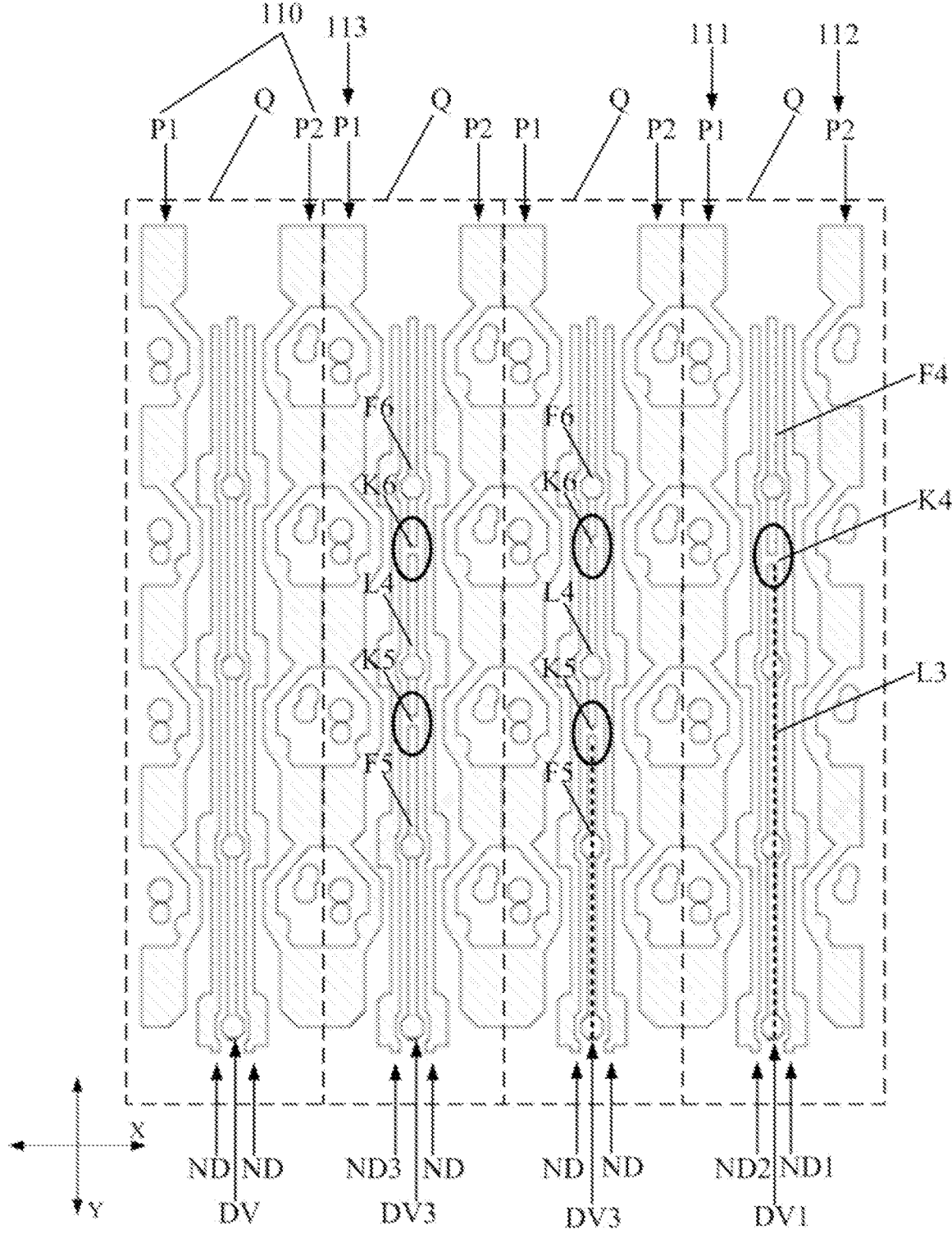
FIG. 13 is a schematic diagram of an exemplary layout of the metal layer where an auxiliary signal line DV and the data signal line ND are located as shown in FIG. 11.

FIG. 11 illustrates a schematic diagram of a partial layout of an exemplary display panel according to various disclosed embodiments of the present disclosure. Specifically, on the basis of the layout in FIG. 10, FIG. 11 illustrates the schematic layout diagram of the first via hole X1 between the metal layer where superimposing the metal layer where the auxiliary signal line DV and the data signal line ND are located and the metal layer where the connection signal line DH is located. FIG. 12 further illustrates a schematic diagram of the layout of the second metal layer where the connection signal line DH is located in FIG. 11. FIG. 13 further illustrates the layout of the first metal layer M3 where the data signal line ND and the auxiliary signal line DV are located in FIG. 11.

In the above two embodiments, the configuration that the first direction X and the second direction Y are perpendicular to each other is used as an example for illustration. As shown in FIG. 11, in the direction perpendicular to the plane where the display panel is located, the overlapping area between the auxiliary signal line DV and the connection signal line DH may be electrically connected through the first via hole X1 between the first metal layer and the second metal layer such that, in the entire display area of the display panel, the first via hole X1 between the first metal layer where the auxiliary signal line DV is located and the second metal layer where the connection signal line DH is located may be uniform and regular, thereby reducing the visibility and display unevenness (Mura) phenomenon of the display panel in the dark state and display state, and improving the display uniformity of the display panel.

It should be noted that, as shown in FIG. 11 and FIG. 12, at least a portion of the connection signal line DH may include a connection section extending along the first direction X (as shown by a dotted line in FIG. 12) and a non-connection section. The connection section may be used to connect the auxiliary signal line DV and the data signal line ND to realize the FIAA connection. The non-connection section may not be used to connect the auxiliary signal line DV and the data signal line ND. There may be a gap between the connection section and the non-connection section such that the connection section and the non-connection section may be disconnected, specifically as shown in the ellipse solid line box in FIG. 12.

Similarly, for the auxiliary signal line DV, as shown in FIG. 11 and FIG. 13, at least a portion of the auxiliary signal line DV may include a connection section extending along the second direction Y (as shown by the dotted line in FIG. 13) and a non-connection section. The connection section may be configured to transmit data signals, and may be electrically connected to the connection section used to transmit data signals in the connection signal line DH. The non-connection section may not be configured to transmit data signals. There may be a gap between the connection section and the non-connection section to separate the connection section and the non-connection section, as shown in the ellipse solid line box in FIG. 13.

In one embodiment, in the direction perpendicular to the plane where the display panel is located, as long as the overlapping area of the auxiliary signal line DV and the connection signal line DH may be electrically connected through the first via hole X1 between the first metal layer and the second metal layer, compared with the display panel shown in FIG. 2, only the position where the auxiliary signal line DV is transferred to connect with the connection signal line DH in the FIAA area, and the overlap position between the auxiliary signal line DV and the connection signal line DH in the non-FIAA area in the direction perpendicular to the plane where the display panel is located may be connected with a via hole. The disconnection of the auxiliary signal line DV and the connection signal line DH in the display panel provided by this embodiment may be different from the previous ones. The details are described in the following.

For the first connection signal line DH1, as shown in FIG. 11 and FIG. 12, the first connection signal line DH1 may include a first connection section L1 and a first non-connection section F1. The first connection section L1 may connect the first auxiliary signal line DV1 between the first column of pixel circuits 111 and the second column of pixel circuits 112 and the third data signal line ND3 correspondingly electrically connected to the third column of pixel circuits 113, and the first connection section L1 may be electrically connected to the first auxiliary signal line DV1 through the first connected via hole X1. The first non-connection section F1 may be located on the side of the first auxiliary signal line DV1 away from the first connected section L1. The first gap K1 between the first connection section L1 and the first non-connection section F1 may be blocked by the first data line ND1.

In one embodiment of the present disclosure, as shown in FIG. 11 and FIG. 12, the first connection signal line DH1 may further include a second non-connection section F10. The second non-connection section F10 may be located at the side of the first connection section L1 away from the first non-connection section F1. There may be a second gap K10 between the second non-connection section F10 and the first connection section L1, and the second gap K10 may be blocked by the third data signal line ND3 in the direction perpendicular to the plane where the display panel is located.

In another embodiment of the present disclosure, as shown in FIG. 11 and FIG. 12, the connection signal line DH may also include a second connection signal line DH2, and at least a portion of the first auxiliary signal line DV1 may be electrically connected to the first connection section L1 in the first connection signal line DH1 through the second connection signal line DH2 along the second direction Y.

The second connection signal line DH2 may include a second non-connection section F2, a second connection section L2 and a third non-connection section F3 arranged in sequence along the first direction X. The second connection section L2 may be electrically connected to the first auxiliary signal line DV1 through the first via hole X1. There may be a second gap K2 between the second non-connection section F2 and the second connection section L2, and there may be a third gap K3 between the second connection segment L2 and the third non-connection section F3.

As shown in the enlarged view of the VV' rectangular area in FIG. 11, in the direction perpendicular to the plane where the display panel is located, the second gap K2 may be blocked by the second data signal line ND2, and the third gap K3 may blocked by the first data signal line ND1.

In one embodiment, the first auxiliary signal line DV1 may be electrically connected to the first connection section L1 in the first connection signal line DH1 after passing through at least one second connection signal line DH2 along the second direction Y, as shown in the first auxiliary signal line DV1 marked in FIG. 11. The first auxiliary signal line DV1 may be electrically connected with the first connection section L1 in the first connection signal line DH1 after passing through two second connection signal lines DH2 along the second direction Y. The passed two connection signal lines DH2 may include a second non-connection section F2, a second connection section L2 and a third non-connection section F3 arranged in sequence along the first direction X. The second connection section L2 may be electrically connected to the first auxiliary signal line DV1 through the first via hole X1. The second gap K2 between the second non-connection section F2 and the second connection section L2 may be blocked by the second data signal line ND2, and the third gap K3 between the third non-connection section F3 and the second connection section L2 may be blocked by the first data signal line ND1.

In one embodiment, the second connection signal line DH2 passed by one first auxiliary signal line DV1 along the second direction Y may also serve as the first connection signal line DH1 electrically connected to another first auxiliary signal line DV1. For example, as shown in FIG. 11 and FIG. 12, the second connection signal line DH2 passed by the first auxiliary signal line DV1 marked in FIG. 11 along the second direction Y may be actually a first connection signal line DH1.

That is to say, in one embodiment, two columns of pixel circuits in any column repeating unit Q and their electrically connected data signal lines ND may be mirrored along the symmetrical line between the two columns of pixel circuits. Further, an auxiliary signal line DV may be set on the symmetrical line between the two columns of pixel circuits. At the same time, a connection signal line DH may be disposed between any two adjacent columns of pixel circuits 120. Through such an arrangement design, not only the disconnection position in the first connection signal line DH1 electrically connected with the first auxiliary signal line DV1 may be blocked by the nearest data signal line ND, and the disconnection position in the second connection signal line DH2 passed by the first auxiliary signal line DV1 along the second direction Y may also be blocked by the nearest data signal line ND. That is, all the disconnection positions in the connection signal lines DH may be blocked by the nearest data signal lines ND. Accordingly, the overlapping areas of any auxiliary signal line DV and any of the connection signal lines DH in the direction perpendicular to the plane of the display panel may be connected by the via holes. Thus, the via holes may be formed regularly and uniformly in the entire display area of the display panel.

As for the auxiliary signal line DV, in one embodiment of the present disclosure, as shown in FIG. 6 and FIG. 7, the display panel may include an anode layer RE, a light-emitting layer OM and a cathode layer SE arranged in sequence along the direction away from the array substrate 100.

Referring to FIG. 11 and FIG. 13, the first auxiliary signal line DV1 may include a third connection section L3 and a fourth non-connection section F4. The third connection section L3 may be electrically connected to the first connection section L1 in the first connection signal line DH1. There may be a fourth gap K4 between the third connection section L3 and the fourth non-connection section F4. In the direction perpendicular to the plane where the display panel is located, the fourth gap K4 may be blocked by the anode layer RE.

Figure 14:
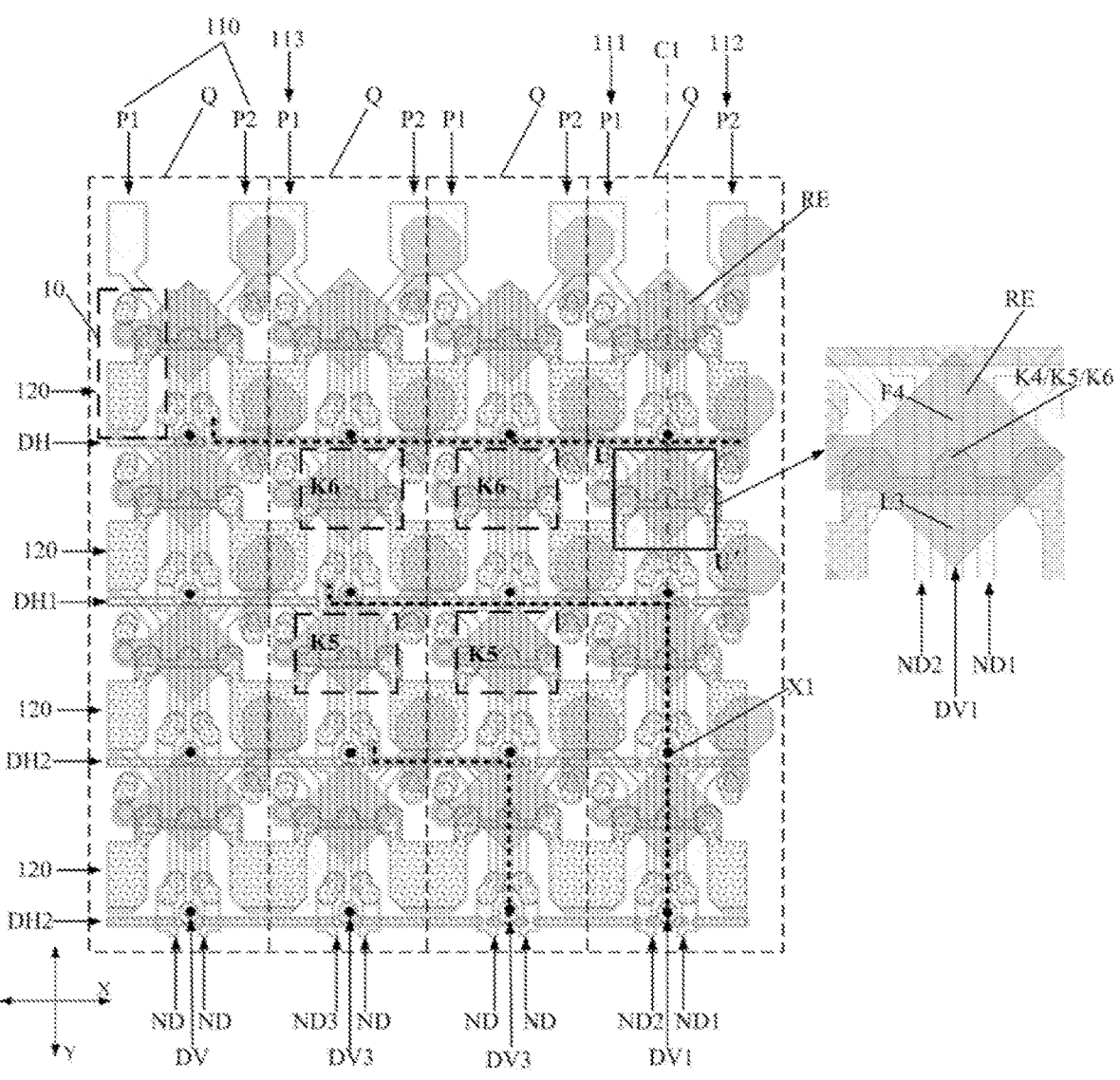
FIG. 14 is a schematic diagram of a partial layout of another exemplary display panel according to various disclosed embodiments of the present disclosure.

FIG. 14 further illustrates a schematic diagram of a partial layout of an exemplary display panel according to various disclosed embodiments. Specifically, FIG. 14 is a schematic diagram of a layout by superimposing the metal layer where the anode layer RE is located on the basis of the layout shown in FIG. 11. As shown from the enlarged view of the UU' rectangular area in FIG. 14, the disconnection position (the fourth gap K4) of the first auxiliary signal line DV1 in the second direction Y may be blocked by the anode layer RE.

On the basis of the above-mentioned embodiments, in one embodiment of the present disclosure, referring to FIG. 13 and FIG. 14, the auxiliary signal line DV may also include a third auxiliary signal line DV3. After the first auxiliary signal line DV1 passes through the third auxiliary signal line DV3 along the first direction X, it may be electrically connected to the third data signal line ND3.

As shown in FIG. 13 and FIG. 14, the third auxiliary signal line DV3 may include a fifth non-connection section F5, a fourth connection section L4 and a sixth non-connection section F6 arranged in sequence along the second direction Y. The fourth connection section L4 may be electrically connected with the first connection signal line DH1 through the first via hole X1. There may be a fifth gap K5 between the fifth non-connection section F5 and the fourth non-connection section L4, and there may be a sixth gap K6 between the fourth connection section L4 and the sixth non-connection section F6.

As shown in the dotted rectangular frame in FIG. 14, it may be understood that the enlarged view of the area marked by these dotted rectangular frames may be similar to the enlarged view of the UU' solid line rectangular frame, and it may be seen that in the direction perpendicular to the plane where the display panel is located, the fifth gap K5 and the sixth gap K6 may be blocked by the anode layer RE.

That is to say, in one embodiment, the disconnection position of the connection signal line DH extending along the first direction X may be blocked by the nearest data signal line ND, meanwhile, the disconnection position of the auxiliary signal line DV extending along the second direction Y may be blocked by the anode layer RE. Because metal can reflect light but not transmit light, the appearance of the display panel may be uniform everywhere, and the reflection effect on light may also be relatively uniform. Moreover, the overlapping area of any auxiliary the signal line and any connection signal line DH in the direction perpendicular to the plane where the display panel is located may be connected by via holes, that is, the via holes may be regularly and uniformly formed in the entire display area of the display panel, thereby significantly reducing visibility display unevenness in the FIAA area and non-FIAA area in the dark state and display state of the display panel, and the display uniformity of the display panel may be improved.

It should be noted that the third auxiliary signal line DV3 passed by the first connection signal line DH1 along the first direction X as may also serve as another first auxiliary signal line DV1 electrically connected to the first connection signal line DH1, for example, as shown in FIG. 13 and FIG. 14, the first connection signal line DH1 marked in FIG. 14 may be electrically connected to the third data signal line ND3 after passing through two third auxiliary signal lines DV3 along the first direction X. The first third auxiliary signal line DV3 passed by first connection signal line DH1 along the first direction X may also be actually a first auxiliary signal line DV1.

On the basis of the above-mentioned embodiments, it may be understood that, in each auxiliary signal line DV, other non-connection sections except for the third connection section L3 in the first auxiliary signal line DV1 and the fourth connection section L4 in the third auxiliary signal line DV3 may not be used to transmit data signals. These non-connection sections may include the entire auxiliary signal lines DV that are not be used to transmit data signals and non-connection sections in the first auxiliary signal line DV1 and the third auxiliary signal line DV3 that are not used to transmit data signals. These non-connection sections in the data signal lines DH that are not used to transmit data signals may generally be called dummy auxiliary signal lines.

Similarly, in each connection signal line DH, other non-connection segments except the first connection segment L1 in the first connection signal line DH1 and the second connection segment L2 in the second connection signal line DH2 may not be used for data signal transmission. These non-connection sections may include the entire connection signal line DH not used to transmit data signals and the non-connection sections not used to transmit data signals in the first connected signal line DH1 and the second connected signal line DH2. Usually, these non-connection sections not used for data signal transmission in the connection signal line DH may be called dummy connection signal lines.

In one embodiment of the present disclosure, as shown in FIGS. 6-7, the display panel may also include a plurality of light-emitting elements D disposed on one side of the array substrate 100. The light-emitting element D may include an anode layer RE, a light-emitting layer OM and a cathode layer SE arranged in sequence in a direction away from the array substrate 100. The cathode layer SE may be set as a whole layer, and the cathode layer SE may be connected to a constant potential. Among the auxiliary signal lines DV and the connection signal lines DH, the non-connection sections except the connection sections electrically connected to the data signal lines ND may be electrically connected to the cathode layer SE.

FIG. 9 illustrates a schematic top view of an exemplary display panel according to various disclosed embodiments of the present disclosure. As shown in FIG. 9, the cathode layer SE may cover the display area AA, and the display panel may also include a first power line PVEE. and the cathode layer SE may be connected to the power pads of the pad area PA through the first power supply line PVEE such that the first power signal output from the power pads of the pad area PA may be transmitted to the cathode layer SE through the first power line PVEE. The cathode layer SE may be shared by each light-emitting element D in the display area AA. The potential of the first power signal transmitted to the cathode layer SE may be a constant within a certain period of time or in a certain working state (such as a certain working brightness).

In fact, due to the resistance on the first power line PVEE and the cathode layer SE, there may be a voltage drop (IR Drop) on the first power line PVEE and the cathode layer SE, resulting in the inconsistent display brightness.

However, in the present disclosure, in each auxiliary signal line DV and each connection signal line DH, except for the connection sections electrically connected to the data signal lines ND, the non-connection sections may all be electrically connected to the cathode layer SE and, then in the auxiliary signal lines DV and the connection signal lines DH, the non-connection sections except the connection sections electrically connected to the data signal lines ND may all be connected in parallel with the cathode layer SE, which may be beneficial to reduce the resistance of the cathode layer SE. Accordingly, the voltage drop in the different regions of the cathode layer SE may tend to be consistent, thereby making the voltage of the cathode layer SE in the entire display area AA tend to be consistent, which may be beneficial to improving the uniformity of display brightness of the display panel.

It should be noted that the constant potential of the cathode layer SE may mean that the potential of the first power signal connected to the cathode layer SE within a certain period of time or under a certain working state (such as a certain working brightness) may be a constant, for example, the potential of the first power signal may be constant within a certain period of time or under a certain working state (for example, under a certain working brightness), but the first power signal may also be changed under different time periods or different brightness.

It should also be noted that, among the auxiliary signal lines DV, the non-connection sections except the connection sections electrically connected to the data signal lines ND may include the entire auxiliary signal lines that are not used to transmit data signals, and the non-connection sections of the first auxiliary signal lines not used for transmitting data signal, e.g., the dummy auxiliary signal line. Similarly, the non-connection sections in each connection signal line DH except the connection sections electrically connected to the data signal line ND may include the entire connection signal line not used to transmit data signals, and the non-connection sections other than the connection section in the connection signal line used to transmit data signals, e.g., the dummy connection signal lines.

In another embodiment of the present disclosure, the non-connection section of each auxiliary signal line DV and each connection signal line DH may also be directly electrically connected to the first power line PVEE, and at this time, may also be connected to the first power signal, which may equivalent to that the non-connection sections of each auxiliary signal line DV and each connection signal line DH may be electrically connected in parallel with the first power line PVEE, which may be beneficial to reduce the resistance on the first power line PVEE, and may also improve the uniformity of the brightness of the display panel.

In the above two embodiments, the non-connection sections of each auxiliary signal line DV and each connection signal line DH may be connected to the first power supply signal of a constant potential, but this disclosure does not limit this. In other implementations of this disclosure, these non-connection sections may also be connected to other constant potential signals.

In one embodiment of the present disclosure, the display panel may further include a plurality of second power lines PVDD. The plurality of second power lines PVDD may be located in the display area and extend along the second direction Y. The second power lines PVDD may be electrically connected to the anode layer RE of the light-emitting elements D and configured to transmit the second power signal to the light-emitting element D. The second power signal may also be a constant potential signal, that is, the potential may be a constant within a certain period of time or in a certain working state (such as a certain working brightness).

In this embodiment, each auxiliary signal line DV and the non-connection section of each connection signal line DH may be electrically connected to the second power line PVDD in the display area AA to access the second power signal with a constant potential. Specifically, as shown in FIG. 6 and FIG. 7, the second power supply line PVDD may be located in the metal layer M2, and the non-connection sections in each auxiliary signal line DV and each connection signal line DH may be electrically connected to the second power line PVDD through the via hole between different metal layers.

The non-connection sections of each auxiliary signal line DV and each connection signal line DH may also be partially connected to the first power signal and partially connected to the second power signal, depending on the specific circumstances.

The specific FIAA connection relationship in the display panels shown in FIG. 11 and FIG. 14 will be described below.

Figure 15:
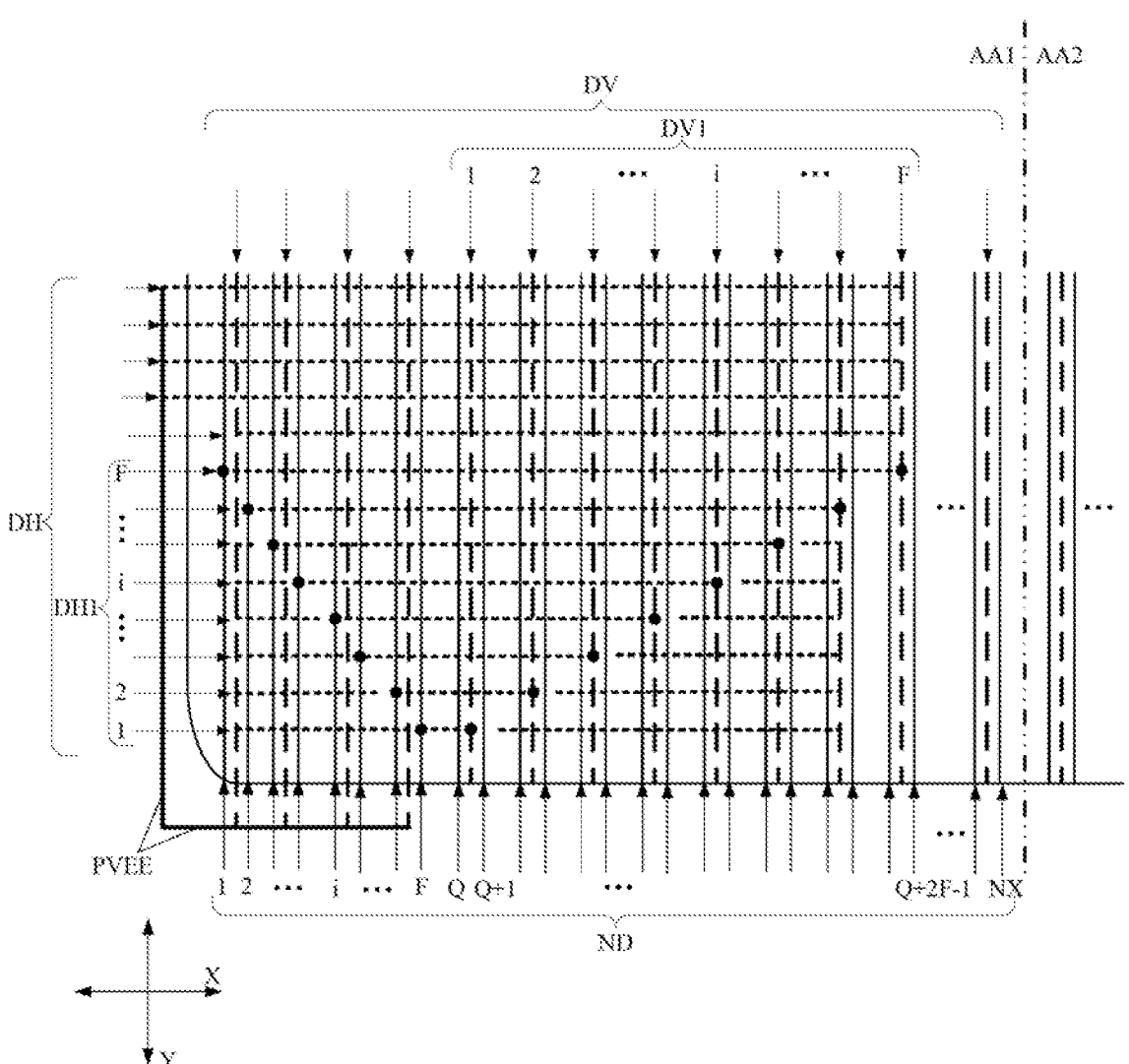
FIG. 15 is a schematic partial top view of an exemplary display panel according to various disclosed embodiments of the present disclosure.

In one embodiment of the present disclosure, as shown in FIG. 15, the number F of data signal lines ND corresponding to the F columns of pixel circuits may be electrically connected the number F of first auxiliary signal lines DV1 between other 2F columns of pixel circuits in one-to-one correspondence through a first auxiliary signal line DV1 corresponding to each of the number F of data signal lines.

Because there may be only one auxiliary signal line DV between two columns of pixel circuits in a column repeating unit Q, in one embodiment, the number F of data signal lines ND corresponding to the F columns of pixel circuits may need to be electrically connected with the number F of first auxiliary signal lines DV1 in one-to-one correspondence, and the number F of first auxiliary signal lines DV1 may need to be arranged between the 2F columns of pixel circuits.

In one embodiment of the present disclosure, as shown in FIG. 1 and FIG. 15, the display panel may include a display area AA. The display area AA may include a first display area AA1 and a second display area AA2.

As shown in FIG. 15, in the direction in which the first display area AA1 points to the second display area AA2, the first display area AA1 may be provided with pixel circuits from the 1st column to the NX-th column. The data signal lines ND corresponding to any column of pixel circuits from the 1st column to the F-th column may be electrically connected to a first auxiliary signal line DV1 between the Q-th column of pixel circuits to the (Q+2F−1)-th column of pixel circuits through a first connection section in a first connection signal line DH1, and F<Q+2F−1<NX.

It should be noted that the pixel circuits are not shown in FIG. 15. It can be understood that, referring to FIG. 14, each column of pixel circuits may be electrically connected to one data signal line ND correspondingly. Two columns of pixel circuits in any column repeating unit Q and the data signal lines ND electrically connected to the two columns of pixel circuits respectively may be mirrored along the symmetrical line between the two columns of pixel circuits, and an auxiliary signal line DV may be arranged on the symmetrical line between the two columns of pixel circuits. Thus, in the direction along which the first display area AA1 points to the second display area AA2, the 1st to the NX-th column of pixel circuits may be disposed in the first display area AA1, and may be corresponding to the 1st to the NX-th data signal lines ND. Any one data signal line ND from the 1st to the NX-th data signal lines ND may be electrically connected to a first auxiliary signal line DV1 between the Q-th to (Q+2F−1)-th data signal lines ND through a first connection section L1 in one first connection signal line DH1.

For example, as shown in FIG. 15, in the direction pointing from the first display area AA1 to the second display area AA2, any data signal lines ND in the first to the eighth data signal lines ND (8 data signal lines ND in total) may be electrically connected to a first auxiliary signal line DV1 between the 9th to the 24th data signal lines ND (16 data signal lines ND in total) through the first connection segment L1 in a first connection signal DH1.

In another embodiment of the present disclosure, as shown in FIG. 15, in the direction pointing from the first display area AA1 points to the second display area AA2, the pixel circuits in the Q-th column to the (Q+2F−1)-th column may include the 1st to the F-th first auxiliary signal line DV1, that is, the 1st to the F-th first auxiliary signal line DV1 may be included between the Q-th to the (Q+2F−1)-th data signal line ND.

The data signal line ND corresponding to the i-th column of pixel circuits (i.e., the i-th data signal line ND) may be electrically connected to the (F+1−i)-th first auxiliary signal line DV1 through the first connection section L1 in a first connection signal line DH1, and 1≤i≤F.

As shown in FIG. 15, because the (F+1−i)-th first auxiliary signal line DV1 counted from the first auxiliary signal line DV1 in the direction pointing from the first display area AA1 to the second display area AA2 may be the i-th first auxiliary signal line DV1 counted from the F-th first auxiliary signal line DV1 along the direction pointing from the first display area AA1 to the second display area AA2, the i-th data signal line ND may be electrically connected to the (F+1−i)-th first auxiliary signal line DV1 through the first connection section L1 in a first connection signal line DH1, and at this time, the first connection signal line DH1 where the first connection section L1 that connects the i-th data signal line ND to the (F+1−i)-th auxiliary signal line DV1 may be denoted as the i-th first connection signal line DH1. Accordingly, the first connection segments L1 in the first connection signal lines DH1 that connects the i-th data signal line ND to the (F+1−i)-th first auxiliary signal lines DV1 may be arranged sequentially along the second direction Y. That is, the i-th first connection signal line DH1 may be arranged in sequence along the second direction Y, and as i increases, the length of the first connection segment L1 in the i-th first connection signal line DH1 may be gradually increased along the first direction Y. Accordingly, each first connection section L1 in the first data signal line DH1 may not overlap with the connection section used to transmit data signals in each first auxiliary signal line DV1. Thus, the coupling interference between different data signals may be reduced.

It should be noted that a portion of the first power supply line PVEE may also be shown in FIG. 15, and it can be seen that among the auxiliary signal lines DV and the connection signal lines DH, except for the connection section electrically connected to the data signal lines ND, the non-connection sections may all be electrically connected to the first power line PVEE to access a constant potential.

Figure 16:
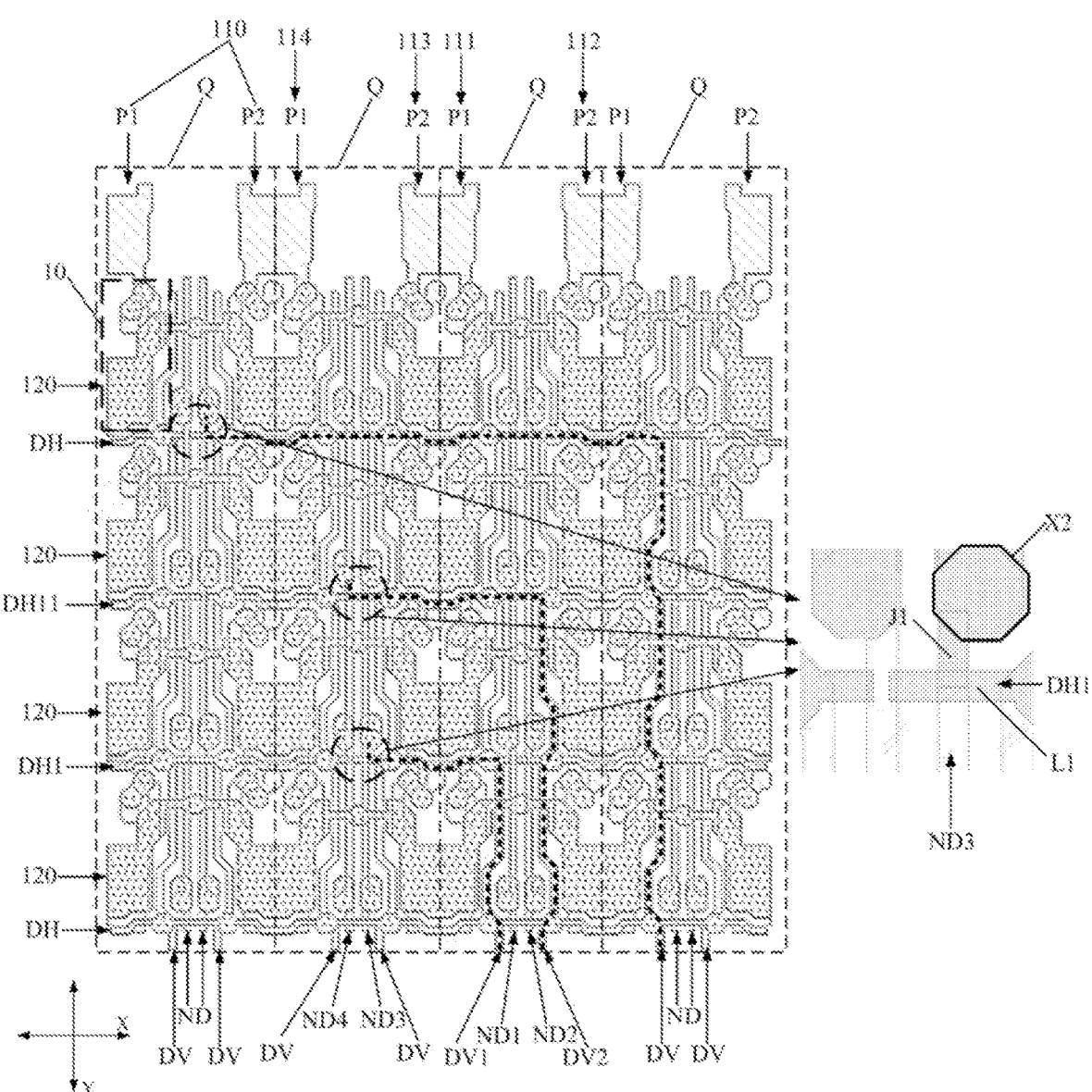
FIG. 16 is a schematic diagram of a partial layout of another exemplary display panel according to various disclosed embodiments of the present disclosure.
Figure 17:
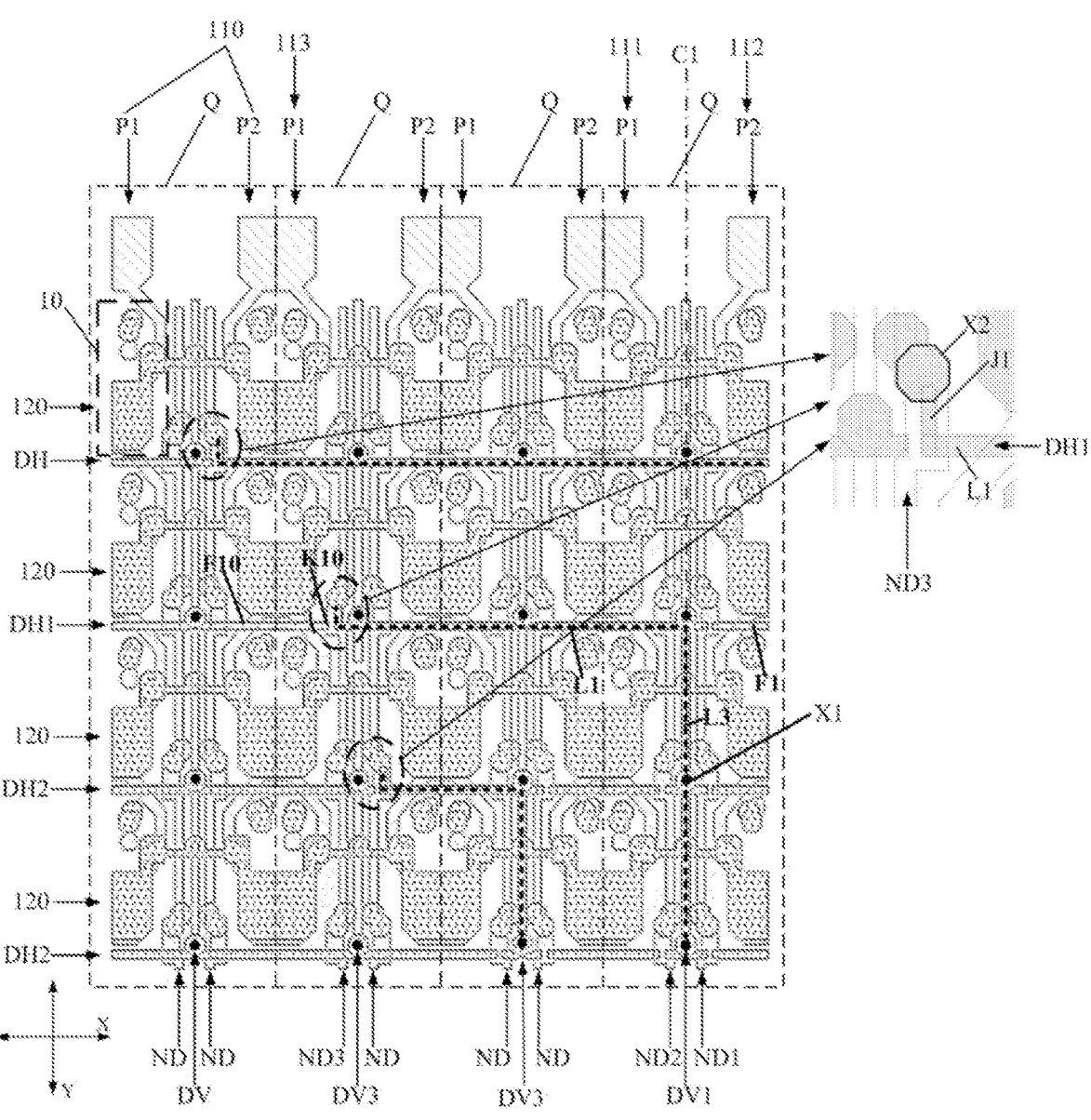
FIG. 17 is a schematic diagram of a partial layout of another exemplary display panel according to various disclosed embodiments of the present disclosure.

On the basis of any of the above-mentioned embodiments, in one embodiment of the present disclosure, as shown in the enlarged diagrams marked with oval dotted lines in FIG. 16 and FIG. 17, the connection section L1 in the first connection signal line DH1 may be electrically connected to the third data signal line ND3 through a first access signal line J1 extending along the second direction Y. FIG. 16 is an enlarged schematic diagram of the connection area between the first connection section L1 in the first connection signal line DH1 and the third data signal line ND3 on the basis of the layout shown in FIG. 2. FIG. 17 is an enlarged schematic diagram of the connection area between the first connection section L1 in the first connection signal line DH1 and the third data signal line ND3 on the basis of the layout shown in FIG. 11.

In one embodiment, as shown in FIG. 6, the third data signal line ND3 may be located on the first metal layer M3, and the first connection signal line DH1 and the first access signal line J1 may both be located on the second metal layer M2. The second metal layer M2 and the first metal layer M3 may be arranged in different layers. Thus, the first connection section L1 in the first connection signal line DH1 may be electrically connected to the first access signal line J1 in the same layer, and the first access signal line J1 may be electrically connected to the third data signal line ND3 through the second via hole between the first metal layer M3 and the second metal layer M2.

In another embodiment, as shown in FIG. 7, the third data signal line ND3 may be located on the first metal layer M4, and the first connection signal line DH1 and the first access signal line J1 may be located on the second metal layer M3. The first metal layer M4 and the second metal layer M3 may be arranged in different layers. Thus, the first connection section L1 in the first connection signal line DH1 may be electrically connected to the first access signal line J1 on the same layer, and the first access signal line J1 may be electrically connected to the third data signal line ND3 through the second via hole between the first metal layer M4 and the second metal layer M3.

It should be noted that, referring to FIG. 4 and FIG. 12, specifically as shown in the rectangular solid line boxes in FIG. 4 and FIG. 12, the first connection signal line DH1 and the first access signal line J1 may be located on the same metal layer (the second metal layer), and the first connection segment L1 in the first connection signal line DH1 may be electrically connected to the first access signal line J1 on the same layer. Because the third data signal line ND3 may be located on the first metal layer, the first connection section L1 in the first connection signal line DH1 may be electrically connected to the third data signal line ND3 through the first access signal line J1 extending along the second direction Y, and the first access signal line J1 may need to be electrically connected to the third data signal line ND3 through the second via hole between the first metal layer and the second metal layer.

It is worth noting that the first via hole X1 between the aforementioned first metal layer and the second metal layer may be located in the area where the auxiliary signal line DV and the connection signal line DH overlap in a direction perpendicular to the plane where the display panel is located. Further, the position of the second via hole between the first metal layer and the second metal layer may be different from that of the first via hole between them.

It should also be noted that the third data signal line ND3 may need to be electrically connected to each pixel circuit 10 in the third column of pixel circuits 113 to provide data signals for each pixel circuit 10 in the third column of pixel circuits 113.

Figure 18:
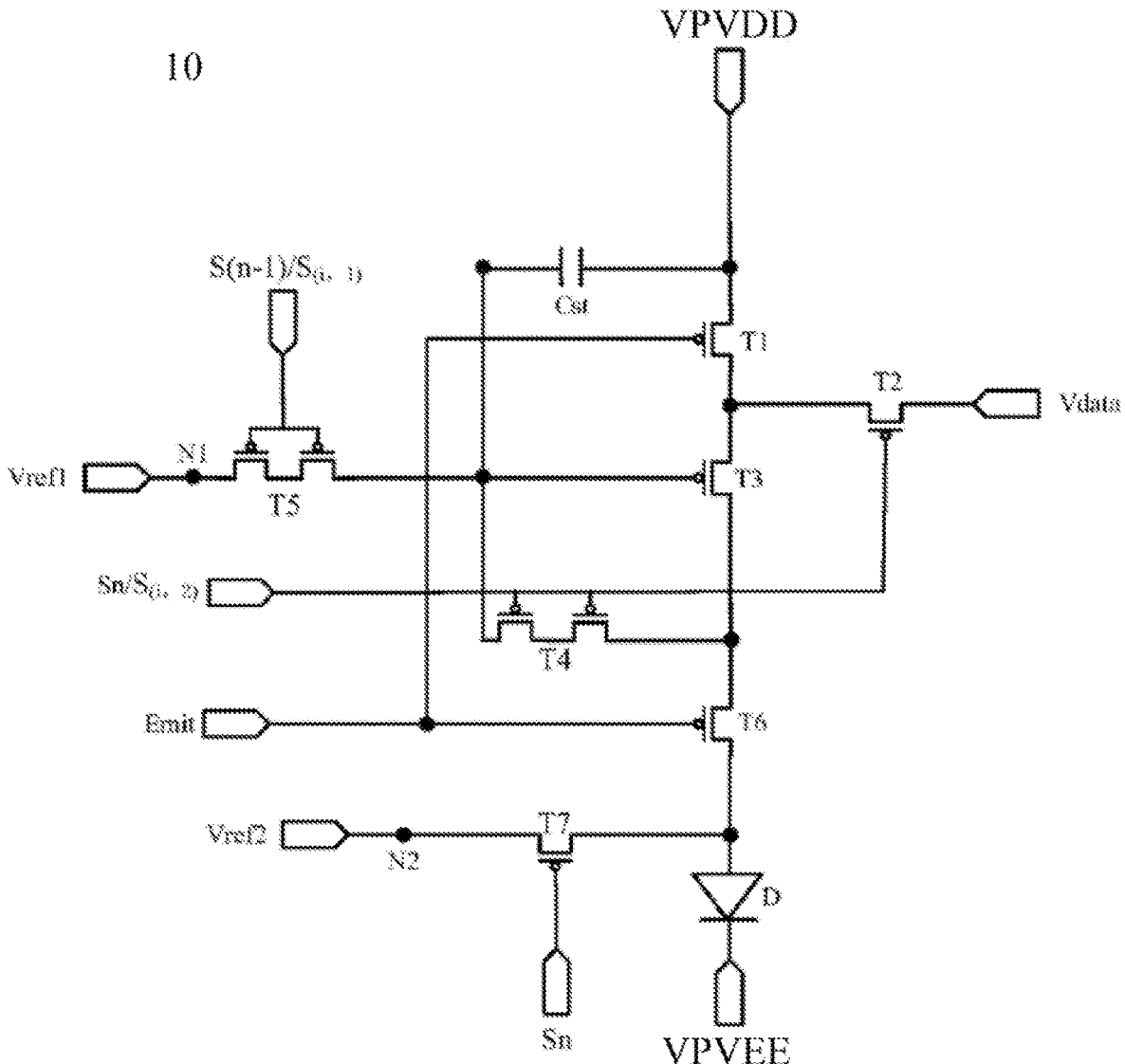
FIG. 18 is a schematic structural diagram of a pixel circuit in an exemplary display panel according to various disclosed embodiments of the present disclosure.

FIG. 18 shows a schematic structural diagram of an exemplary pixel circuit 10. As shown in FIG. 18, the pixel circuit may include a storage capacitor Cst and seven thin-film transistors T1-T7. T1 may be a power writing transistor, T2 may be a data writing transistor, T3 may be a driving transistor, T4 may be a compensation transistor, T5 may be a gate reset transistor, T6 may be a light-emission control transistor, T7 may be an anode initialization transistor, D may be a light-emitting element, VPVEE may be a first power signal, VPVDD may be a second power signal, Vdata may be a data signal, S(n−1) may be a first scanning signal, Sn may be a second scanning signal, and N1 and N2 may represent connection nodes. The electrical connection of each thin-film transistor is illustrated in FIG. 18, which will not be repeated here. It can be seen from FIG. 18 that the data writing transistor T2 may need to receive the data signal Vdata. The present disclosure does not limit the specific circuit structure of the pixel circuit 10, for example, the pixel circuit 10 may also include other forms of circuit structures than those shown in FIG. 2, depending on the situation.

In one embodiment, the pixel circuit 10 may include a plurality of thin-film transistors. The plurality of thin-film transistors may include a first transistor (such as the data writing transistor T2 in FIG. 18), and the first electrode of the first transistor may be used to receive the data signal Vdata.

Figure 19:
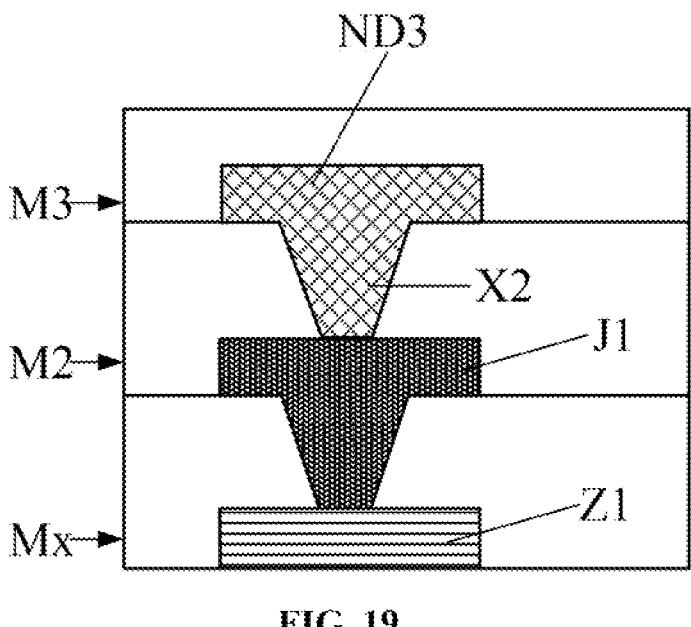
FIG. 19 is a schematic partial cross-sectional view of an exemplary display panel according to various disclosed embodiments of the present disclosure.

Moreover, in one embodiment, as shown in FIG. 19, the first electrode Z1 of the first transistor (such as the data writing transistor T2 in FIG. 18) may be located on the third metal layer Mx. The third metal layer Mx may be located on the side of the second metal layer M2 facing away from the first metal layer M3.

As shown in FIG. 19, the third data signal line ND3 may also be electrically connected to the first electrode Z1 of the first transistor through the second via hole X2.

It should be noted that, to realize the electrical connection between the first connection section L1 in the first connection signal line DH1 and the third data signal line ND3, a through hole connection may need to be performed in the overlap area between the first connection section L1 in the first connection signal line DH1 and the third data line ND3 in the direction perpendicular to the plane where the display panel is located. Further, to realize the electrical connection between third data signal line ND3 and the first electrode Z1 of each first transistor 10 in the third columns of pixel circuits 113, a through hole connection may need to be performed in the overlap area between the third data signal line ND3 and the first electrode Z1 of each pixel circuit 10 in the third columns of pixel circuits 113 in a direction perpendicular to the plane where the display panel is located.

Figure 20:
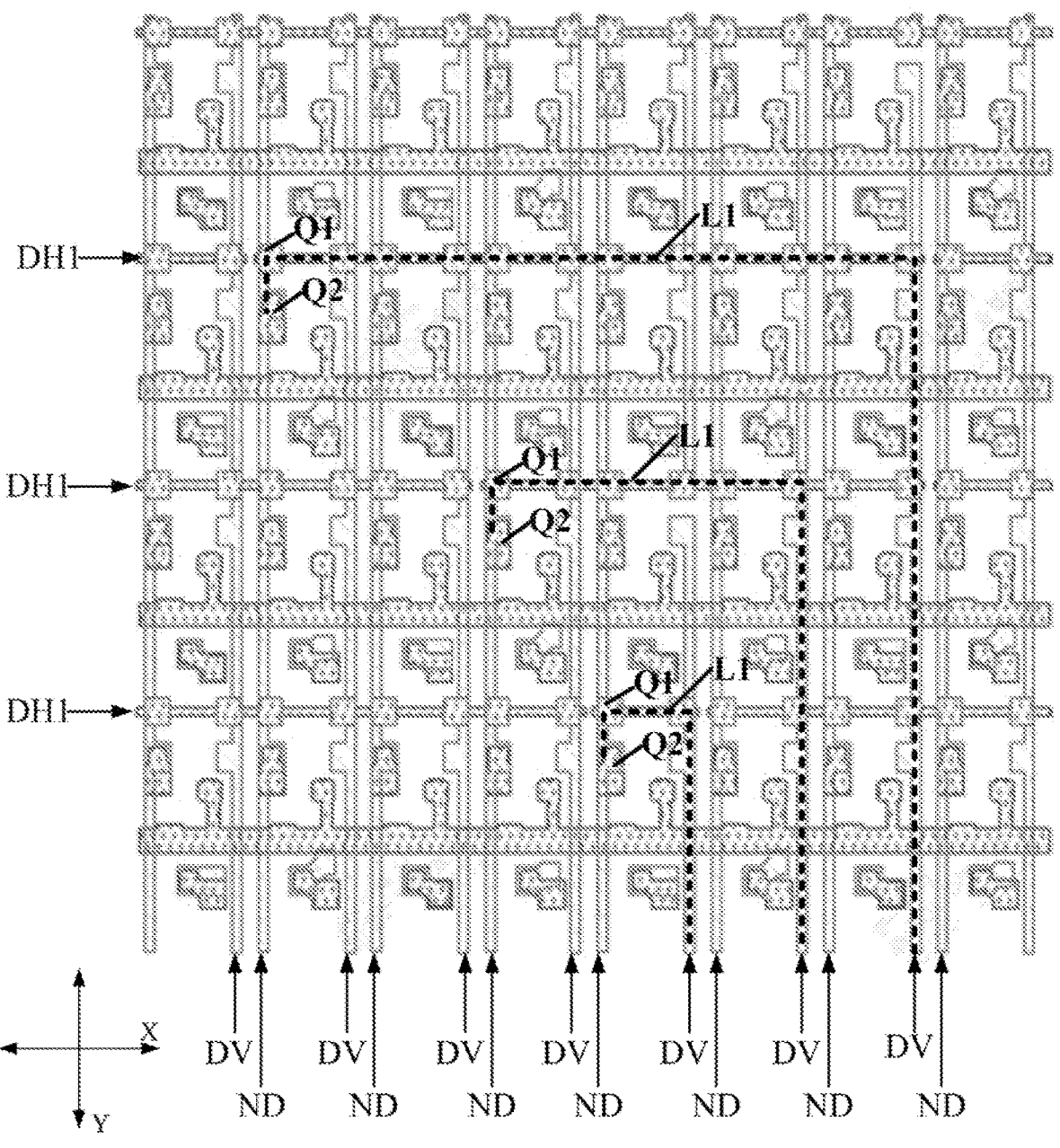
FIG. 20 is a schematic diagram of a partial layout of a display panel.

Therefore, in the existing FIAA display panel, as shown in FIG. 20, at the position where the first connection section L1 of the first connection signal line DH1 is connected to the third data signal line ND3, not only a first via hole Q1 may be formed between the second metal layer (the metal layer where the first connection signal line DH1 is located) and the first metal layer (the metal layer where the third data signal line ND3 is located), but also a second via hole Q2 may be formed between the first metal layer (the metal layer where the third data signal line ND3 is located) and the third metal layer Mx (the metal layer where the first electrode Z1 of the first transistor in the pixel circuit 10 is located). For example, at the positions where the first connection section L1 in the first connection signal line DH1 is connected to the third data signal line ND3, two via holes Q1 and Q2 may need to be formed in the third data signal line ND3.

In the display panel provided by the present disclosure, as shown in FIG. 16, FIG. 17 and FIG. 19, by setting the first access signal line J1 extending along the second direction Y, the first connection section L1 in the first connection signal line DH1 may be electrically connected to the first access signal line J1 on the same layer, and the first access signal line J1 may be electrically connected with the third data signal line ND3 through the second via hole X2 between the first metal layer and the second metal layer. At the same time, the second via hole X2 is a via hole for electrically connecting the third data signal line ND3 with the first electrode Z1 of the first transistor in the pixel circuit 10, thereby reducing the number of via holes at the position where the first connection section L1 in the first connection signal line DH1 is connected to the third data signal line ND3.

It can be understood that, as shown in FIG. 16 and FIG. 17, because the first connection segment L1 in some first connection signal lines DH1 may be connected to the data signal lines ND corresponding to the left P1 column of pixel circuits in a column repeating unit Q, while the first connection section L1 in some first connection signal lines DH1 may be connected to the data signal line ND corresponding to the pixel circuits in the P2 column on the right side of the column repeating unit Q, and the data signal line ND corresponding to the pixel circuits in the P1 column and the data signal line ND corresponding to the pixel circuits in the P2 column may be mirrored along the symmetrical line between the two, the arrangement of the data signal lines corresponding to the P1 column of pixel circuits on the left side of a column repeating unit Q connected by the first connection section L1 and the arrangement of the data signal line ND corresponding to the P2 column of pixel circuits on the right side of the column repeating unit Q connected by the first connection section L1 may also be mirrored along the symmetrical line between the P1 column of pixel circuits and the P2 column of pixel circuits. Only the positions in the second direction Y may be different.

Also, in existing FIAA display panels, the plurality of thin-film transistors in the pixel circuit 10 generally may only include LTPO transistors. The reason may be that the LTPO transistors require fewer metal layers to leave enough space for forming the first via hole Q1 and the second via hole Q2.

In the display panel provided in this disclosure, the multiple thin-film transistors in the pixel circuits 10 may include both LTPO transistors and IGZO transistors. Although the multiple thin-film transistors in the pixel circuits 10 may include both LTPO transistors and IGZO transistors and the metal wiring space may be reduced, because the number of via holes at the positions where the first connection section L1 in the first connection signal line DH1 is connected to the third data signal line ND3 is reduced, even if the metal wiring space is reduced, the FIAA connection may still be possible. At the same time, the driving ability of the LTPO transistors may be relatively strong, and the leakage current of the IGZO transistors may be relatively small. Therefore, the plurality of thin-film transistors in the pixel circuits 10 include LTPO transistors and IGZO transistors at the same time, the influence of the leakage current may be reduced while maintaining the driving ability of the pixel circuits 10.

Considering that the first access signal line J1 may need to be set only at the position where the first connection section L1 in the first connection signal line DH1 is connected to the third data signal line ND3, this may also cause the difference in line density of metal wiring in the FIAA area and the non-FIAA area, resulting in the uneven visibility in the dark state and display state between the FIAA area and the non-FIAA area. Based on this, in one embodiment of the present disclosure, as shown in FIG. 6 and FIG. 7, the display panel may further include a plurality of light-emitting elements D located on one side of the array substrate 100, and the light-emitting element D may include an anode layer RE, a light-emitting layer OM and a cathode layer SE arranged sequentially in the direction away from the array substrate 100.

As shown in the ellipse dotted line box in FIG. 8, in the direction perpendicular to the plane where the display panel is located, the first access signal line J1 may be blocked by the anode layer SE such that the light on the FIAA area and the non-FIAA area reflected by the metal wiring may be more uniform. Accordingly, the unevenness of visual display in the FIAA area and non-FIAA area of the display panel in the dark state and the display state may be reduced, and the display uniformity of the display panel may be improved.

In another embodiment of the present disclosure, as shown in the enlarged view marked with an elliptical dotted line in FIG. 17, in the direction perpendicular to the plane where the display panel is located, the first access signal line J1 may be blocked by the data signal line ND3 such that the light in the FIAA area and the non-FIAA area reflected by the metal wiring may be relatively uniform, and the unevenness of the visual display in the FIAA area and the non-FIAA area in the display panel in the dark state and the display state may be reduced; and the display uniformity of the display panel may be improved.

Figure 21:
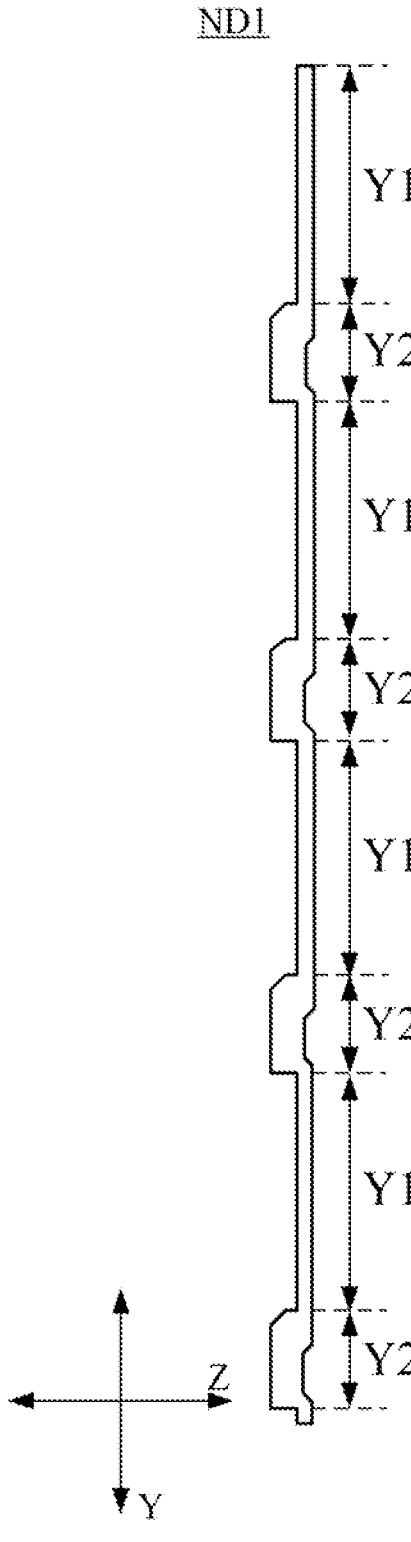
FIG. 21 is a schematic diagram of a partial layout of a first data signal line ND1 in an exemplary display panel according to various disclosed embodiments of the present disclosure.

FIG. 21 illustrates a partial layout diagram of the first data signal line ND1 in another exemplary display panel according to various disclosed embodiments of the present disclosure. As shown in FIG. 21, based on any of the above-mentioned embodiments, to make the first gap K1 blocked by the first data signal line ND1 in the direction perpendicular to the plane where the display panel is located, in one embodiment of the present disclosure, the first data signal line ND1 may include a first extension section Y1 and a second extension section Y2 interconnected each other. In a direction perpendicular to the plane where the display panel is located, the first gap K1 may be blocked by the second extension section Y2.

The width of the second extension section Y2 in a third direction Z may be greater than the width of the first extension section Y1 in the third direction Z. The third direction Z may be perpendicular to the second direction Y.

In one embodiment, to make the first data signal line ND1 block the first gap K1 in the direction perpendicular to the plane where the display panel is located, the width of the second extension section Y2 of the first data signal line ND1 for blocking the first gap K1 may be greater than the width of the first extension section Y1 that is not used to block the first gap K1. The width of each extension section in the first data signal line ND1 may be the width of the extension section of the first data signal line ND1 in the third direction Z perpendicular to the extension direction of the first data signal line ND1 (the second direction Y).

It can be understood that, as shown in FIG. 13, the first data signal line ND1 may extend along the second direction Y as a whole. The second direction Y as a whole may be the longitudinal direction in FIG. 3, and the first direction X as a whole may be the lateral direction in FIG. 13. At this time, the first direction X and the third direction Z may be parallel to each other.

Specifically, the width of the first gap K1 in the first direction X may be 2.5 μm, and the width of the first extension section Y1 in the first data signal line ND1 in the first direction X may be 1.8 μm. The width of the second extension section Y1 in the first data signal line ND1 in the first direction X may be 4.5 μm.

In another embodiment of the present disclosure, the overall width of the first data signal line ND1 in the first direction X may be larger than the width of the first gap K1 in the first direction X such that the first data signal line ND1 may block the first gap K1 in a direction perpendicular to the plane of where the display panel is located.

Based on any of the above embodiments, in one embodiment of the present disclosure, as shown in FIG. 3, the display panel may include a display area AA, a fan-out area FA and a pad area PA. The fan-out area FA may be provided with a plurality of lead wires S1 sequentially arranged along the first direction X. The lead wires S1 may extend from the pad area PA to the display area AA. Some of the lead wires S1 may be electrically connected to the first auxiliary signal line DV1, and some of the lead wires S1 may be electrically connected to the data signal line ND1.

That is, in one embodiment, in the fan-out area FA, a portion of the lead wires S1 may be electrically connected to the auxiliary signal line for the FIAA connection, and a portion of the lead wires S1 may be directly electrically connected to the normal data signal line, thereby realizing the FIAA connection.

Figure 22:
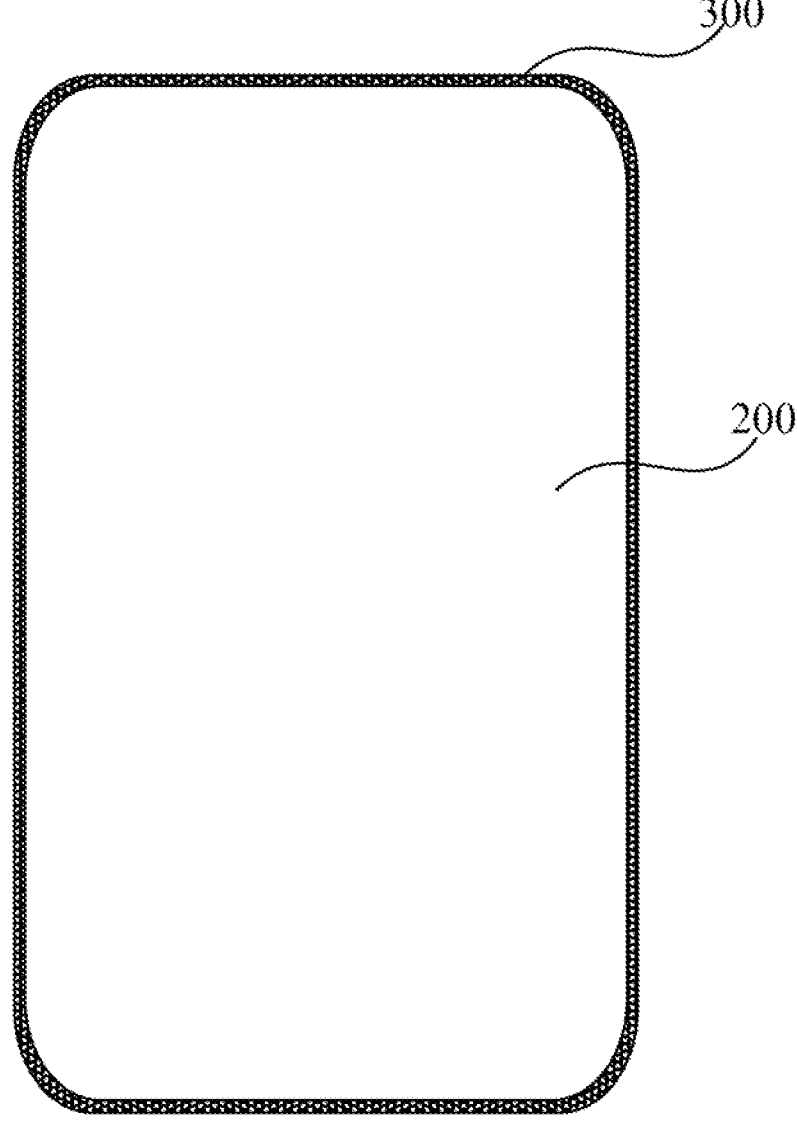
FIG. 22 is a schematic structural diagram of an exemplary display device according to various disclosed embodiments of the present disclosure.

The present disclosure also provides a display device. FIG. 22 illustrates an exemplary display device according to various disclosed embodiments of the present disclosure. As shown in FIG. 22, the display device 300 may include the display panel 200 provided in any one of the above embodiments, or other appropriate display panel. Because the display panel 200 has been described in detail in the foregoing embodiments, it will not be repeated here.

The display device 300 may be any electronic device with a display function, such as a touch screen, a mobile phone, a tablet computer, a notebook computer, an electronic paper book, or a television, etc.

Thus, the present disclosure provides a display panel and a display device. The display panel may be provided with a first auxiliary signal line extending along a second direction between two columns of pixel circuits adjacently arranged along a first direction. The first direction may intersect with the second direction such that the first auxiliary signal line may be electrically connected to the data signal line corresponding to the pixel circuits in another column through the first connection segment in the first connection signal line extending along the first direction to realize the FIAA connection. Further, because the gap in the first connection signal line caused by the transfer connection between the first auxiliary signal line and the first connection section in the first connection signal line may be blocked by the first data signal line electrically connected to a column of pixel circuits between the two adjacent columns of pixel circuits, the light reflected by the metal wiring in the FIAA area and the non-FIAA area may be relatively uniform, and the uneven visibility of the FIAA area and the non-FIAA area in the display panel in the dark state and the display state may be reduced, and the display uniformity of the display panel may be improved.

Each portion in this disclosure is described in a parallel and progressive manner, and each portion may focus on the differences from other portions, and the same and similar part of each portion can be referred to each other.

For the above description of the disclosed embodiments, the features recorded in each embodiment in this specification may be replaced or combined with each other, such that those skilled in the art may implement or use the present disclosure. Various modifications to these embodiments will be readily apparent to those skilled in the art, and the general principles defined herein may be implemented in other embodiments without departing from the spirit or scope of the disclosure. Therefore, the present disclosure will not be limited to the embodiments shown herein, but is to be accorded the widest scope consistent with the principles and novel features disclosed herein.

What is claimed is:

1. A display panel, comprising:
an array substrate including multiple columns of pixel circuits arranged along a first direction and extending along a second direction,
wherein the first direction intersects the second direction, the multiple columns of pixel circuits include a first column of pixel circuits and a second column of pixel circuits adjacently arranged in the second direction, and a third column of pixel circuits different from the first column of pixel circuits and the second column of pixel circuits; a first data signal line and a first auxiliary signal line extending along the second direction are arranged between the first column of pixel circuits and the second column of pixel circuits, the first auxiliary signal line is located a side of the data signal line adjacent to the third column of pixel circuits, the first data signal line is electrically connected to the first column of pixel circuits or the second column of pixel circuits, the first auxiliary signal line is electrically connected to a third data signal line corresponding to the third column of pixel circuits through a first connection section in the first connection signal line extending in the first direction, the first connection signal line further includes a first non-connection section, the first non-connection section is located on a side of the first auxiliary signal line away from the first connection section, a first gap is formed between the first connection section and the first non-connection section; and in a direction perpendicular to a plane where the display panel is located, the first gap is blocked by the first data signal line.

2. The display panel according to claim 1, wherein the first data signal line comprises:
a first extension section and a second extension section connected to each other,
wherein:
in the direction perpendicular to the plane where the display panel is located, the first gap is blocked by the first data signal line along the second extension section;
a width of the second extension section in a third direction is greater than a width of the first extension section in the third direction; and
the third direction is perpendicular to the second direction.

3. The display panel according to claim 1, wherein:
the first column of pixel circuits are located on a side of the second column of pixel circuits adjacent to the third column of pixel circuits; and
the first data signal line is electrically connected to the first column of pixel circuits.

4. The display panel according to claim 3, wherein:
a second data signal line extending in the second direction is also disposed between the first column of pixel circuits and the second column of pixel circuits;
the second data signal line is located at a side of the first data signal line adjacent to the second column of pixel circuits;
the second signal line is electrically connected to the second column of pixel circuits;
the first auxiliary signal line is located on a side of the first data signal line and the second data signal line as a whole adjacent to the third column of pixel circuits.

5. The display panel according to claim 4, wherein:
a second auxiliary signal line extending along the second direction is also disposed between the first column of pixel circuits and the second column of pixel circuits; and
the second auxiliary signal line is located at a side of the first data signal line and the second data signal line as a whole away from the third column of pixel circuits.

6. The display panel according to claim 1, wherein:
the first column of pixel circuits are located at a side of the second column of pixel circuits adjacent to the third column of pixel circuits; and
the first data signal line is electrically connected to the second column of pixel circuits.

7. The display panel according to claim 6, wherein:
a second data signal line extending in the second direction is also disposed between the first column of pixel circuits and the second column of pixel circuits;
the second data signal line is located at a side of the first data signal line adjacent to the first column of pixel circuits;
the second data signal line is electrically connected to the first column of pixel circuits; and
the first auxiliary signal line is located between the first data signal line and the second data signal line.

8. The display panel according to claim 7, wherein:
a second auxiliary signal line extending in the second direction is also disposed between the first column of pixel circuits and the second column of pixel circuits; and
the second auxiliary signal line is also located between the first data signal line and between the second data signal line.

9. The display panel according to claim 7, wherein:

a first symmetrical line extending along the second direction is located between the first column of pixel circuits and the second column of pixel circuits;

the first column of pixel circuits and the second column of pixel circuits are mirrored along the symmetrical line;

the first data signal line and the second data signal line are mirrored along the first symmetrical line; and the first auxiliary signal line is located on the first symmetrical line.

10. The display panel according to claim 9, wherein:

the multiple columns of pixel circuits include a plurality of column repeating units arranged in the first direction;

the plurality of column repeating units include two columns of pixel circuits adjacently arranged in the first direction;

the two columns of pixel circuits respectively electrically connected a data signal line and an auxiliary signal line arranged between the two columns of the pixel circuits;

a symmetrical line extending along the second direction is located between the two columns of pixel circuits;

the two columns of pixel circuits and respective electrically connected data signal lines are mirrored along the symmetrical line between the two columns of pixel circuits and the auxiliary signal line between the two columns of pixel circuits is located on the symmetrical line between the two columns of pixel circuits;

the first column pixel circuits and the second column of pixel circuits form a column repeating unit;

the data signal line includes the first data signal line, the second data signal line and the third data signal line;

the auxiliary signal line includes the first auxiliary signal line;

the multiple columns of pixel circuits also form multiple rows of pixel circuits arranged along the second direction;

a connection signal line extending along the first direction is arranged between two adjacent rows of pixel circuits; and the connection signal line includes the first connection signal line.

11. The display panel according to claim 10, wherein:

the auxiliary signal line is located on a first metal layer;

the connection signal line is located on a second metal layer;

the first metal layer and the second metal layer are located in different layers; and along the direction perpendicular to the plane where the display panel is located, overlap areas between the auxiliary signal line and the connection signal line are connected through a via hole between the first metal layer and the second layer.

12. The display panel according to claim 11, wherein:

the connection signal line also includes a second connection signal line;

at least a portion of the first auxiliary signal line is electrically connected to the first section of in the first connection signal line after passing through the second connection signal line in the second direction;

the second connection signal line includes a second non-connection section, a second connection section and a third non-connection section arranged in sequence in the first direction;

the second connection section is electrically connected the first auxiliary signal line through the first via hole;

there is a second gap between the second non-connection section and the second connection section;

there is a third gap between the second connection section and the third non-connection section; and in the direction perpendicular to the plane where the display panel is located, the second gap is blocked by the second data signal line, and the third gap is blocked by the first data signal line.

13. The display panel according to claim 11, further comprising:

a plurality of light-emitting elements located on one side of the array substrate, a light-emitting element of the plurality of light-emitting elements includes an anode layer, a light-emitting layer, and a cathode layer arranged in sequence in a direction away from the array substrate;

the first auxiliary signal line includes a third connection section and a fourth non-connection section;

the third connection section is electrically connected to the first connection section in the first connection signal line;

a fourth gap is between the third connection section and the fourth non-connection section; and in a direction perpendicular to the plane where the display panel is located, the fourth gap is blocked by the anode layer.

14. The display panel according to claim 13, wherein:

the auxiliary signal line further includes a third auxiliary signal line;

at least a portion of the first connection section in the first connection signal line is electrically connected to the third data signal line after passing through the third auxiliary signal line in the first direction;

the third auxiliary signal line includes a fifth non-connection section, a fourth connection section, and a sixth non-connection section sequentially arranged along the second direction;

the fourth connection section is connected to the first connection section in the first data signal line through the first via hole;

a fifth gap is between the fifth non-connection section and the fourth connection section;

a sixth gap is between the fourth connection section and the sixth non-connection section; and in a direction perpendicular to the plane where the display panel is located, the fifth gap and the sixth gap are blocked by the anode layer.

15. The display panel according to claim 10, further comprising:

a plurality of light-emitting elements located on one side of the array substrate, wherein:

a light-emitting element of the plurality of light-emitting elements includes an anode layer, a light-emitting layer, and a cathode layer arranged in sequence in the direction away from the array substrate;

the cathode layer is set as an entire layer and is connected to a constant potential;

in each of the auxiliary signal lines and each of the connection signal lines, the non-connection sections except the connection sections electrically connected to the data signal lines are electrically connected to the cathode layer.

16. The display panel according to claim 10, wherein:

a number F of data signal lines corresponding to F columns of pixel circuits are electrically connected to a number F of first auxiliary signal lines between other 2F columns of pixel circuits in a one-to correspondence through a first connection section in one first connection signal line corresponding the number F of data signal lines.

17. The display panel according to claim 16, comprising:

a display area including a first display area and a second display area symmetrically arranged in the second direction;

in a direction in which the first display area points to the second display area, the first display area is provided with a 1st column of pixel circuits to an NX-th column of pixel circuits;

a data signal line corresponding to any one column of the pixel circuits in the 1st column of pixel circuits to the F column of pixel circuits is electrically connected to one of the first auxiliary signal lines between a Q-th column of pixel circuits to the (Q+2F−1)-th column of pixel circuits through the first connection section in the first connection signal line; and $$F < Q+2F-1 < NX.$$

18. The display panel according to claim 17, wherein:

in the direction in which the first display area points to the second display area, the pixel circuits in the Q-th column to the (Q+2F−1)-th column include a 1st to an F-th first auxiliary signal lines;

the data signal line corresponding to an i-th column of pixel circuits is electrically connected to an (F+1−i)-th first auxiliary signal line through a first connection section in the first connection signal line; and $$1 \leq i \leq F.$$

19. The display panel according to claim 1, wherein:

the first connection section in the first connection signal line is electrically connected to the third data signal line through a first access signal line extending in the second direction;

the third data signal line is located on a first metal layer;

the first connection signal line and the first access signal line are both located on a second metal layer;

the second metal layer and the first metal layer are arranged in different layers;

the first connection section in the first connection signal line is electrically connected to the first access signal line on a same layer;

the first access signal line is electrically connected to the third data signal line through a second via hole between the first metal layer and the second metal layer;

a pixel circuit includes a plurality of thin-film transistors;

the plurality of thin-film transistors include a first transistor;

a first electrode of the first transistor is used to receive a data signal;

the first electrode of the first transistor is located on a third metal layer;

the third metal layer is located on a side of the second metal layer away from the first metal layer; and the third data signal line is also electrically connected to the first electrode of the first transistor through the second via hole.

20. A display device, comprising:

a display panel, including an array substrate, wherein the array substrate includes multiple columns of pixel circuits arranged along a first direction and extending in a second direction, the first direction intersects the second direction, the multiple columns of pixel circuits include a first column of pixel circuits and a second column of pixel circuits adjacently arranged in the second direction, and a third column of pixel circuits different from the first column of pixel circuits and the second column of pixel circuits; a first data signal line and a first auxiliary signal line extending along the second direction are arranged between the first column of pixel circuits and the second column of pixel circuits, the first auxiliary signal line is located a side of the data signal line adjacent to the third column of pixel circuits, the first data signal line is electrically connected to the first column of pixel circuits or the second column of pixel circuits, the first auxiliary signal line is electrically connected to a third data signal line corresponding to the third column of pixel circuits through a first connection section in the first connection signal line extending in the first direction, the first connection signal line further includes a first non-connection section, the first non-connection section is located on a side of the first auxiliary signal line away from the first connection section, a first gap is formed between the first connection section and the first non-connection section; and in a direction perpendicular to a plane where the display panel is located, the first gap is blocked by the first data signal line.

* * * * *